(12) United States Patent
Nagao et al.

(10) Patent No.: US 12,046,641 B2
(45) Date of Patent: Jul. 23, 2024

(54) SiC SEMICONDUCTOR DEVICE WITH INSULATING FILM AND ORGANIC INSULATING LAYER

(71) Applicant: ROHM CO., LTD., Kyoto (JP)

(72) Inventors: Katsuhisa Nagao, Kyoto (JP); Hidetoshi Abe, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 179 days.

(21) Appl. No.: 16/878,326

(22) Filed: May 19, 2020

(65) Prior Publication Data

US 2020/0279923 A1 Sep. 3, 2020

Related U.S. Application Data

(63) Continuation of application No. 15/311,459, filed as application No. PCT/JP2015/064102 on May 15, 2015, now Pat. No. 10,692,978.

(30) Foreign Application Priority Data

May 16, 2014 (JP) ................................ 2014-102699

(51) Int. Cl.
*H01L 29/16* (2006.01)
*H01L 23/535* (2006.01)
(Continued)

(52) U.S. Cl.
CPC ........ *H01L 29/1608* (2013.01); *H01L 23/535* (2013.01); *H01L 23/60* (2013.01);
(Continued)

(58) Field of Classification Search
CPC ... H01L 29/1608; H01L 23/535; H01L 23/60; H01L 29/0615; H01L 29/0619;
(Continued)

(56) References Cited

U.S. PATENT DOCUMENTS 6,975,014 B1 * 12/2005 Krivokapic ....... H01L 29/42384
257/E21.415
8,558,308 B1 * 10/2013 Blank ................ H01L 29/1095
438/270
(Continued)

FOREIGN PATENT DOCUMENTS

CN 1802752 7/2006
EP 1906454 4/2008
(Continued)

OTHER PUBLICATIONS

Office Action issued for Japanese Patent Application No. 2019-183297, Dispatch Date: Oct. 7, 2020, 16 pages Including English machine translation.
(Continued)

*Primary Examiner* — David Chen
(74) *Attorney, Agent, or Firm* — XSENSUS LLP

(57) ABSTRACT

According to the present invention, a semiconductor device includes a first conductivity type SiC layer, an electrode that is selectively formed upon the SiC layer, and an insulator that is formed upon the SiC layer and that extends to a timing region that is set at an end part of the SiC layer. The insulator includes an electrode lower insulating film that is arranged below the electrode, and an organic insulating layer that is arranged so as to cover the electrode lower insulating film. The length (A) of the interval wherein the organic insulating layer contacts the SiC layer is 40 μm or more, and the lateral direction distance (B) along the electrode lower insulating layer between the electrode and SiC layer is 40 μm or more.

29 Claims, 15 Drawing Sheets

(51) Int. Cl.
*H01L 23/60* (2006.01)
*H01L 29/06* (2006.01)
*H01L 29/36* (2006.01)
*H01L 29/423* (2006.01)
*H01L 29/47* (2006.01)
*H01L 29/51* (2006.01)
*H01L 29/739* (2006.01)
*H01L 29/78* (2006.01)
*H01L 29/872* (2006.01)
*H01L 23/31* (2006.01)

(52) U.S. Cl.
CPC ...... *H01L 29/0615* (2013.01); *H01L 29/0619* (2013.01); *H01L 29/36* (2013.01); *H01L 29/4236* (2013.01); *H01L 29/47* (2013.01); *H01L 29/51* (2013.01); *H01L 29/739* (2013.01); *H01L 29/78* (2013.01); *H01L 29/7811* (2013.01); *H01L 29/872* (2013.01); *H01L 23/3171* (2013.01)

(58) Field of Classification Search
CPC ..... H01L 29/36; H01L 29/4236; H01L 29/47; H01L 29/51; H01L 29/739; H01L 29/78; H01L 29/7811; H01L 29/872; H01L 23/3171; H01L 29/42368
USPC ......... 257/77, 265, 272, 288, 379, E27.016, 257/E29.104; 438/382, 518
See application file for complete search history.

(56) References Cited

U.S. PATENT DOCUMENTS

| | | | |
|---|---|---|---|
| 2002/0052077 | A1 | 5/2002 | Tee et al. |
| 2006/0220026 | A1 | 10/2006 | Uchida et al. |
| 2006/0278934 | A1 | 12/2006 | Nagahama |
| 2007/0075362 | A1* | 4/2007 | Wu ............... H01L 29/7813 257/E29.155 |
| 2007/0176230 | A1 | 8/2007 | Uchida et al. |
| 2008/0286968 | A1 | 11/2008 | Carta et al. |
| 2009/0026535 | A1 | 1/2009 | Matsuura et al. |
| 2010/0148718 | A1* | 6/2010 | Kitabatake ............ H01L 23/62 257/280 |
| 2010/0314629 | A1 | 12/2010 | Tarui et al. |
| 2011/0069047 | A1 | 3/2011 | Koyama et al. |
| 2011/0248284 | A1 | 10/2011 | Carta et al. |
| 2012/0087460 | A1 | 4/2012 | Moriwaki |
| 2012/0097980 | A1 | 4/2012 | Masuda |
| 2012/0146055 | A1* | 6/2012 | Mitani ............... H01L 29/0692 257/77 |
| 2012/0313147 | A1 | 12/2012 | Anderson et al. |
| 2013/0001699 | A1 | 1/2013 | Tai et al. |
| 2013/0089940 | A1* | 4/2013 | Arai ................. H01L 27/1225 438/34 |
| 2014/0197422 | A1 | 7/2014 | Wada et al. |
| 2014/0225114 | A1* | 8/2014 | Furukawa ........... H01L 27/0296 257/48 |
| 2014/0291697 | A1* | 10/2014 | Rupp .................. H01L 23/291 257/77 |
| 2014/0332865 | A1* | 11/2014 | Haematsu ........... H01L 29/7786 257/288 |
| 2015/0001688 | A1 | 1/2015 | Iguchi |
| 2015/0041828 | A1 | 2/2015 | Nagao |
| 2016/0141371 | A1* | 5/2016 | Tega ................ H01L 29/66068 257/77 |
| 2016/0172437 | A1 | 6/2016 | Masuda |
| 2016/0181415 | A1 | 6/2016 | Masuda |

FOREIGN PATENT DOCUMENTS

| | | |
|---|---|---|
| JP | S5445570 | 4/1979 |
| JP | S6050937 | 3/1985 |
| JP | H03235368 | 10/1991 |
| JP | 2001176876 | 6/2001 |
| JP | 2006156772 | 6/2006 |
| JP | 2006344802 | 12/2006 |
| JP | 2007048889 | 2/2007 |
| JP | 2007103524 | 4/2007 |
| JP | 2008518445 | 5/2008 |
| JP | 2008277365 | 11/2008 |
| JP | 2008294301 | 12/2008 |
| JP | 200932951 | 2/2009 |
| JP | 2009187994 | 8/2009 |
| JP | 2009272449 | 11/2009 |
| JP | 2011171374 | 9/2011 |
| JP | 2011243837 | 12/2011 |
| JP | 2012142487 | 7/2012 |
| JP | 2012160485 | 8/2012 |
| JP | 2012191038 | 10/2012 |
| JP | 2013080893 | 5/2013 |
| JP | 2013134998 | 7/2013 |
| JP | 2013187438 | 9/2013 |
| JP | 2013191632 | 9/2013 |
| JP | 2014011342 | 1/2014 |
| JP | 2014027076 | 2/2014 |
| JP | 2021048413 A | 3/2021 |
| WO | 2007136391 | 11/2007 |
| WO | 2009101668 | 8/2009 |
| WO | 2010147032 | 12/2010 |
| WO | WO-2013042406 A1 * | 3/2013 ............ H01L 23/60 |
| WO | 2013103051 | 7/2013 |
| WO | 2013172140 | 11/2013 |

OTHER PUBLICATIONS

Extended European Search Report issued for European Patent Application No. 20201356.1, dated Jan. 27, 2021, 12 pages.
International Search Report for PCT/JP2015/064102, dated Jul. 7, 2015, 5 pages including English translation.
International Preliminary Report on Patentability for PCT/JP2015/064102, dated Dec. 1, 2016, 13 pages Including English translation.
Office Action issued for Japanese Patent Application No. 2014-102699, dated Sep. 27, 2017, 13 pages including English translation.
Partial Supplementary European Search Report issued for European Patent Application No. 15793063.7, dated Nov. 7, 2017, 18 pages.
Charatan, R. M. et al., "Investigations of TiN and Ti film deposition by plasma activated CVD using cyclopentadienyl cycloheptatrienyl titanium, a low oxidation state precursor," Materials Research Society Symposium Proceedings, 1994, pp. 329-334, vol. 334, Materials Research Society, United States of America.
Fortin, V. et al., "Effect of in situ plasma oxidation of TiN diffusion barrier for AlSiCu/TiN/Ti metallization structure of Integrated circuits," Journal of Vacuum Science & Technology B-Microelectronics and Nanometer Structures, Mar./Apr. 1999, pp. 423-431, vol. 17, No. 2, American Vacuum Society, United States of America.
Decision to Grant a Patent issued for Japanese Patent Application No. 2014-102699, dated Dec. 7, 2017, 5 pages including English translation.
Office Action issued for Chinese Patent Application No. 201580025434.X, dated Mar. 1, 2019, 20 pages including English translation.
Office Action issued for Japanese Patent Application No. 2018-001243, Dispatch Date: Apr. 18, 2019, 13 pages Including English translation.
First Office Action issued for Chinese Patent Application No. 202010090401.6, dated Feb. 8, 2023, 11 pages Including partial English machine translation.
Notice of Reasons for Refusal issued for Japanese Patent Application No. 2021-163271, Dispatch Date: Oct. 13, 2022, 11 pages including English machine translation.
Office Action issued Sep. 14, 2023 in Chinese Patent Application No. 202010090424.7, 18 pages.
Chinese Office Action issued Jul. 4, 2023, in corresponding Chinese Patent Application No. No.202010090401.6 and its English machine translation, 13pp.
Office Action issued Aug. 2, 2023 in corresponding European Divisional Patent Application No. 20201356.1, 6 pages.

(56) References Cited

OTHER PUBLICATIONS

Office Action mailed Oct. 27, 2023, in Chinese Application No. 202010090401.6, 14 pages.
Chinese Second Office Action issued Mar. 16, 2024 in corresponding Chinese Patent Application No. 202010090424.7, 11 pages.

* cited by examiner

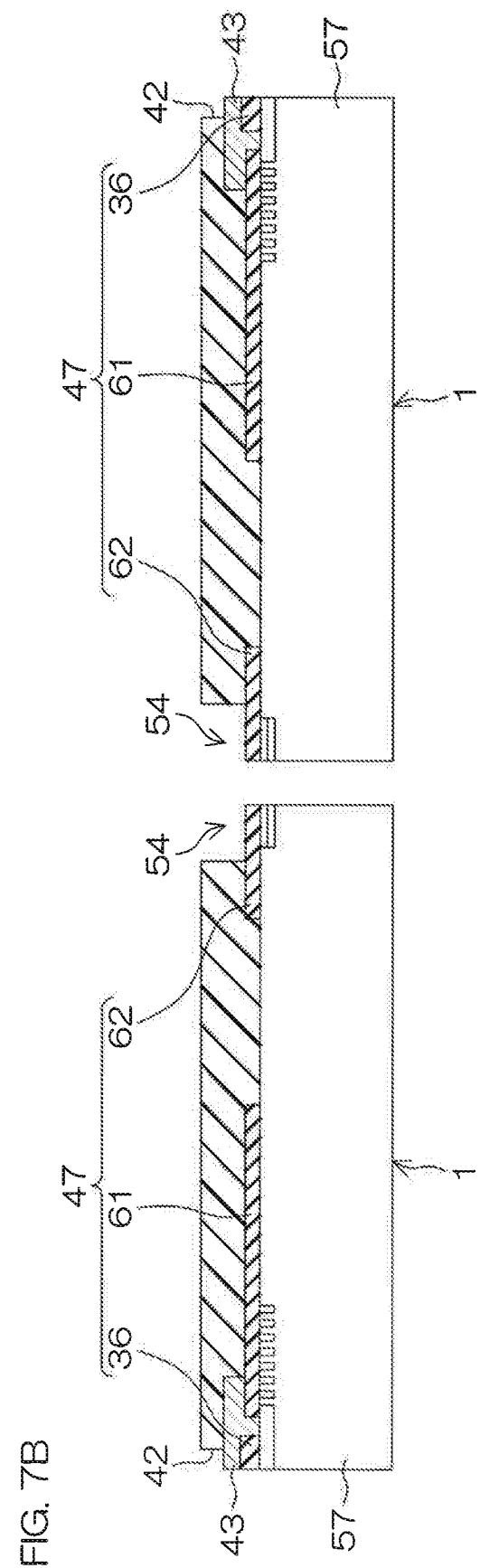

SiC SEMICONDUCTOR DEVICE WITH INSULATING FILM AND ORGANIC INSULATING LAYER

TECHNICAL FIELD

The present invention relates to a silicon carbide (SiC) semiconductor device.

BACKGROUND ART

In the past, various proposals have been made to prevent inconveniences when testing the characteristics of a semiconductor device. For example, in the patent literature 1, a measure is proposed to prevent electrical discharge from occurring in the atmosphere during a test of electrical characteristics. Specifically, the patent literature 1 discloses a method for manufacturing a semiconductor device including steps of forming a base region and an emitter region in a semiconductor wafer, patterning a base electrode and an emitter electrode, coating and patterning the surface thereof with a polyimide film, and covering regions excluding a dicing region and other electrode bonding portions.

PRIOR ART DOCUMENT

Patent Literature

Patent literature 1: Japanese Unexamined Patent Application Publication No. S60-50937
Patent literature 2: Japanese Unexamined Patent Application Publication No. S54-45570
Patent literature 3: Japanese Unexamined Patent Application Publication No. 2011-243837
Patent literature 4: Japanese Unexamined Patent Application Publication No. 2001-176876
Patent literature 5: Domestic re-publication of PCT international application No. 2009/101668

SUMMARY OF THE INVENTION

Problems to be Solved by the Invention

By the way, recently high-temperature/high-humidity/high-voltage tests have started to be adopted as a test of a semiconductor device. In these tests, a semiconductor device is exposed to conditions of, for example, 85° C., 85% RH, and an applied voltage of 960V for 1000 consecutive hours (approximately 40 days). Conventionally, measures were individually taken to sufficiently meet each condition of the above-described temperature, humidity, and voltage, however, measures that meet all of these three conditions have yet to be proposed.

Therefore, an embodiment according to the present invention provides a SiC semiconductor device capable of withstanding a high-temperature/high-humidity/high-voltage test while preventing electrical discharge during an electric characteristic test carried out in a wafer state.

Means for Solving the Problem

A semiconductor device according to an embodiment of the present invention includes a SiC layer of a first conductivity type, an electrode selectively formed on the SiC layer, and an insulator formed on the SiC layer, reaching a dicing region provided at the end portion of the SiC layer, wherein the insulator includes an insulating film under electrode arranged under the electrode and an organic insulating layer arranged so as to cover the insulating film under electrode, wherein a distance (A) of a section where the organic insulating layer is in contact with the SiC layer is 40 μm or greater, and a lateral distance (B) between the electrode on the insulating film under electrode and the SiC layer is 40 μm or greater.

According to this configuration, the dicing region is covered with an insulator, and thus when testing the electrical characteristics of a semiconductor device in a wafer state, the burden of a voltage applied in the atmosphere between the dicing region and the electrode can be reduced. In other words, the voltage applied between the dicing region and the electrode can be shared by the atmosphere and the insulator, and thus electrical discharge in the atmosphere can be prevented.

Further, since the distance (A) is 40 μm or greater, a contact area between an organic insulating layer and a SiC layer can be sufficiently secured, and thus the adhesion of the organic insulating layer to the SiC layer can be improved. In addition, the distance (B) is 40 μm or greater, and thus the semiconductor device can withstand a high-temperature/high-humidity/high-voltage test. Setting the distance (A) and the distance (B) to the above described range is a quite new finding in a semiconductor device. In a SiC, since the expansion of a depletion layer in the lateral direction is smaller than in a Si, conventionally a chip size did not need to be increased by extending the distance (A) and the distance (B). This is not only because the depletion layer was unlikely to reach the end surface of a chip even without increasing the chip size, but because an increase in chip size possibly caused a rise in on-resistance per a unit of chip area. Under this background, the inventors of this application successfully found that the durability against a high-temperature/high-humidity/high-voltage tests could be improved by purposely extending the distance (A) and the distance (B) to 40 μm or greater.

In a case where the semiconductor device further includes a region of a second conductivity type formed in the dicing region, the distance (A) of a section in which the organic insulating layer is in contact with the first conductivity type region of the SiC layer may be 40 μm or greater.

According to this configuration, the voltage applied between the dicing region and the electrode can also be distributed to the region of the second conductivity type. Thereby, the electrical discharge in the atmosphere can be further effectively prevented.

The organic insulating layer may be formed so as to cover the dicing region and may be in contact with the region of the second conductivity type in the dicing region.

In a case where the organic insulating layer does not cover the dicing region, and the insulator further includes an end insulating film that is made of a film of the same layer as that of the insulating film under electrode, the end insulating film covering the dicing region while being partly overlapped by the organic insulating layer, an overlapped width (C) between the organic insulating layer and the end insulating film may be 5 μm or greater.

According to this configuration, the dicing region is not covered with the organic insulating layer, and thus the semiconductor devices in a wafer state can be easily divided (diced). Even in this case, the dicing region is covered with the end insulating film composing the insulator, and thus the above-described electrical discharge prevention effect is sufficiently ensured.

In a case where the insulator further includes the end insulating film that is made of a film of the same layer as that of the insulating film under electrode, and covers the dicing region, the organic insulating film overlaps the end insulating film so as to selectively cover the region of the second conductivity type across the end insulating film, and the overlapped width (C) between the organic insulating layer and the end insulating film may be 5 μm or greater.

The end insulating film may have the same thickness as that of the insulating film under electrode.

According to this configuration, the end insulating film and the insulating film under electrode can be made in the same process, and thus the manufacturing process can be simplified.

The distance (A) may be in the range of 45 μm to 180 μm, and the distance (B) may be in the range of 45 μm to 180 μm. Further, the total of the distance (A) and the distance (B) may be 180 μm or less.

By setting the distance (A) and the distance (B) within the above-decried range, the chip size of a semiconductor device can be kept within a suitable range. Further, since electrical discharge in the atmosphere is likely to occur when the distance (A) and the distance (B) are set within the above range, covering the dicing region with the insulator will be useful.

The breakdown voltage (BV) of the semiconductor device may be 1000 V or greater.

Since electrical discharge in the atmosphere is likely to occur when the breakdown voltage (BV) is 1000 V or greater, covering the dicing region with the insulator will be useful.

The concentration of impurities of the first conductivity type in the SiC layer may be $1 \times 10^{16}$ cm$^{-3}$ or less, and the thickness of the SiC layer may be 5 μm or greater.

In a case where the semiconductor device further includes a termination structure of the second conductivity type composed of an impurity region formed outside the electrode in the SiC layer, the width (F) of the second conductivity type region may be greater than or equal to the difference between the width (D) of the dicing region and a width which is twice as large as the width (E) of a depletion layer extending from the termination structure.

The electrode may be composed of a laminate structure represented by Ti/TiN/Al—Cu.

The durability against humidity can be further improved by using Al—Cu.

The insulating film under electrode may be composed of an SiO$_2$ film with a thickness of 1 μm or greater. In this case, the SiO$_2$ film may contain phosphorus (P) or boron (B).

Dielectric breakdown can be prevented even when a voltage greater than or equal to 1000 V is applied to the insulating film under electrode, provided that the SiO$_2$ film with a thickness of 1 μm or greater is employed. Further, the insulating film under electrode can be easily planarized by reflow soldering provided that phosphorus (P) or boron (B) is contained therein. Also, the corners of the insulating film under electrode can be rounded off.

The insulating film under electrode may be composed of a SiN film with a thickness of 1 μm or greater.

Dielectric breakdown can be prevented even when a voltage of 1000 V or greater is applied to the insulating film under electrode, provided that a SiN film with a thickness of 1 μm or greater is employed.

The organic insulating layer may be composed of, for example, a polyimide-based material, apolybenzoxazole-based material, or an acrylic-based material.

A MOSFET is formed as a semiconductor element structure in the SiC layer, and the electrode may include a source electrode electrically connected to a source of the MOSFET. In this case, the MOSFET may have a planar-gate structure, or a trench-gate structure.

Also, a schottky-barrier diode is formed as a semiconductor element structure in the SiC layer, and the electrode may include a schottky electrode composing part of the schottky-barrier diode.

Further, an IGBT is formed as a semiconductor element structure in the SiC layer, and the electrode may include a source electrode electrically connected to a source of the IGBT.

In a case where the organic insulating layer is in contact with the SiC layer in a plurality of regions, the distance (A) as a total distance of the contact sections in each of the plurality of regions may be 40 μm or greater.

In a case where the semiconductor device is selectively formed in the SiC layer, and further includes a recess portion filled with the organic insulating layer, the distance (A) defined as the total distance of the contact section in contact with the organic insulating layer including the inner surface of the recess portion may be 40 μm or greater.

A semiconductor device according to an embodiment of the present invention includes a SiC layer of a first conductivity type, an electrode selectively formed on the SiC layer, and an insulator formed on the SiC layer, reaching a dicing region provided at the end portion of the SiC layer, and a termination structure of a second conductivity type composed of an impurity region formed outside the electrode in the SiC layer, wherein the insulator includes an insulating film under electrode arranged under the electrode and an organic insulating layer arranged so as to cover the insulating film under electrode; a distance (A) of a section where the organic insulating layer is in contact with the SiC layer is 40 μm or greater; and a lateral distance (B) between the electrode on the insulating film under electrode and the SiC layer is at least two times larger than the width (E) of a depletion layer extending from the termination structure.

According to this configuration, since the dicing region is covered with the insulator, when testing the electrical characteristics of a semiconductor device in a wafer state, an applied voltage can be decreased by the insulator. Thereby, the burden of a voltage applied in the atmosphere between the dicing region and the electrode can be reduced. In other words, the voltage applied between the dicing region and the electrode can be shared by the atmosphere and the insulator, and thus electrical discharge in the atmosphere can be prevented.

Further, since the distance (A) is 40 μm or greater and the distance (B) is twice as large as the width (E) of a depletion layer extending from the termination structure, the semiconductor device according to an embodiment of the present invention can withstand a high-temperature/high-humidity/high-voltage tests.

BRIEF DESCRIPTION OF THE DRAWINGS

FIG. 7B is a cross-sectional view illustrating a state of a wafer after being cut.

EMBODIMENT FOR PRACTICING THE INVENTION

Hereinafter, an embodiment according to the present invention will be described in detail with reference to the attached drawings.

Figure 1:
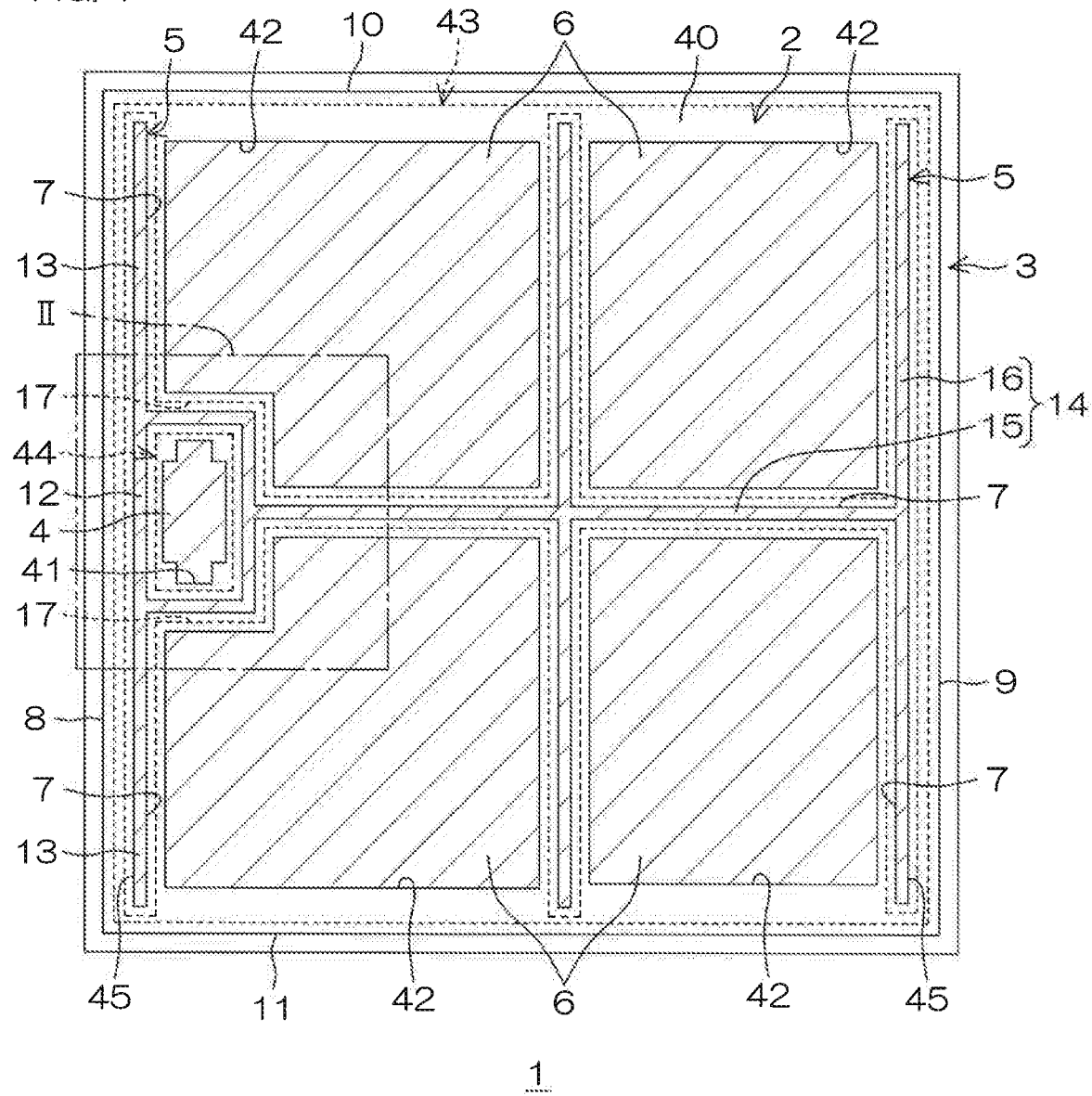
FIG. 1 is a schematic plan view of a semiconductor device according to an embodiment of the present invention.

FIG. 1 is a schematic plan view of a semiconductor device according to an embodiment of the present invention. Referring to FIG. 1, part of an element not exposed from the outer most surface of a semiconductor device 1 in actual plan view is shown in solid lines for the sake of clarity.

The semiconductor device 1 employs SiC, which is made in rectangular chip form in plan view when the outermost surface is viewed along a normal line thereto (hereinafter, simply referred to as "plan view").

The semiconductor device 1 is provided with an active region 2 and an outer peripheral region 3 that surrounds the active region 2. In this embodiment the active region 2 is formed in a substantially rectangular shape in plan view in the inner portion of the semiconductor device 1, but the shape is not particularly limited.

In the active region 2, a gate metal 44, a source metal 43 as an example of an electrode according to the present invention, and a gate finger 5 are formed. A passivation film 40 is formed on the outermost surface of the semiconductor device 1 to cover these parts. The passivation film 40 is provided with openings 41, 42 to expose part of the gate metal 44 and part of the source metal 43 as a gate pad 4 and a source pad 6, respectively. Meanwhile, a whole of the gate finger 5 is covered with the passivation film 40. For the sake of clarity, the gate finger 5 is shown in solid lines while being hatched.

The gate metal 44, the gate finger 5 and the source metal 43 are made of metal wires that are composed of, for example, aluminum (Al), alloy of aluminum and copper (AlCu), copper (Cu) and so forth. Preferably, these parts are composed of a laminate structure represented by Ti/TiN/Al—Cu, which will be detailed later in the description of FIG. 6.

With the gate finger 5 constituted by a metal wire having a lower resistance compared to polysilicon, a gate current can be supplied in a short time even to a transistor cell 18 (see FIG. 2) that is positioned relatively far away from the gate metal 44 (distant position). Further, Al is excellent in workability (easy to be worked), and thus formation steps of wiring can be made easier. Meanwhile, AlCu is capable of increasing the durability of the semiconductor device 1 against power cycle and humidity compared to a case where Al is employed, while increasing the joint strength of a bonding wire to the gate pad 4. When Cu is employed, a resistivity can be advantageously reduced compared to a case where Al or AlCu is employed.

The gate metal 44 is selectively formed in part of the peripheral edge (near a boundary with the outer peripheral region 3) of the active region 2. The gate finger 5 is divided into two parts with each extending from the formation position of the gate pad 4 along the peripheral edge of the active region 2 and in the inner portion of the active region 2. Thereby, the active region 2 is provided with a portion partitioned by a plurality of gate fingers 5 that extends in different directions with the gate metal 44 interposed therebetween, and cell regions 7, 45 outside the gate fingers 5.

More specifically, in this embodiment, the gate metal 44 is formed in a rectangular shape in plan view, and is selectively arranged at the center portion of a side 8 of the active region 2. A side 9 that faces the side 8 and sides 10, 11 consecutively connected to both ends of these sides 8, 9 are provided in addition to the side 8 (where the gate metal is arranged) as the sides forming the active region 2.

The gate finger 5 includes a pad periphery 12 that surrounds the gate metal 44 with a distance therefrom, and a first finger 13 and a second finger 14 each extending along the side 8 of the active region 2 from the pad periphery 12 and in a direction orthogonal to the side 8.

The pad periphery 12 is formed in an annular rectangular shape along the periphery of the gate metal 44.

A pair of the first fingers 13 is formed along the side 8 extending from the pad periphery 12 toward the side 10 and the side 11 opposite the side 10.

The second finger 14 includes a linear base part 15 crossing the active region 2 to the side 9 in a direction orthogonal to the first finger 13, and a plurality of branch parts 16 integrally connected to the base part 15, extending from the connection portion with the base part 15 along the first fingers 13. In this embodiment, totally two pairs of branch parts 16 are formed and connected to two positions that are the tip end of the base part 15 and the middle portion of the base part 15, however the number of the branch parts 16 is not particularly limited.

Thereby, the cell regions 7, 45 are partitioned by the first finger 13 and the second finger 14 (base part 15 and branch part 16) in the active region 2. In this embodiment, a total of four inner cell regions 7 is formed with each one positioned at each corner of the intersection formed by the base part 15 and the central branch part 16. Further an annular outer cell region 45 is formed along the periphery of the active region 2 between the periphery of the active region 2 and the gate finger 5.

The source metal 43 is formed to cover substantially a whole of the inner cell region 7 and the outer cell region 45. The passivation film 40 is provided with totally four openings 42 so that the source pad 6 is respectively arranged in each inner cell region 7.

Further, a recess 17 is formed in accordance with the shape of the gate metal 44. The recess 17 is arranged with the gate metal 44 set back from the first finger 14 toward the inner portion of an active region 2, and is formed to avoid the gate metal 44.

Figure 2:
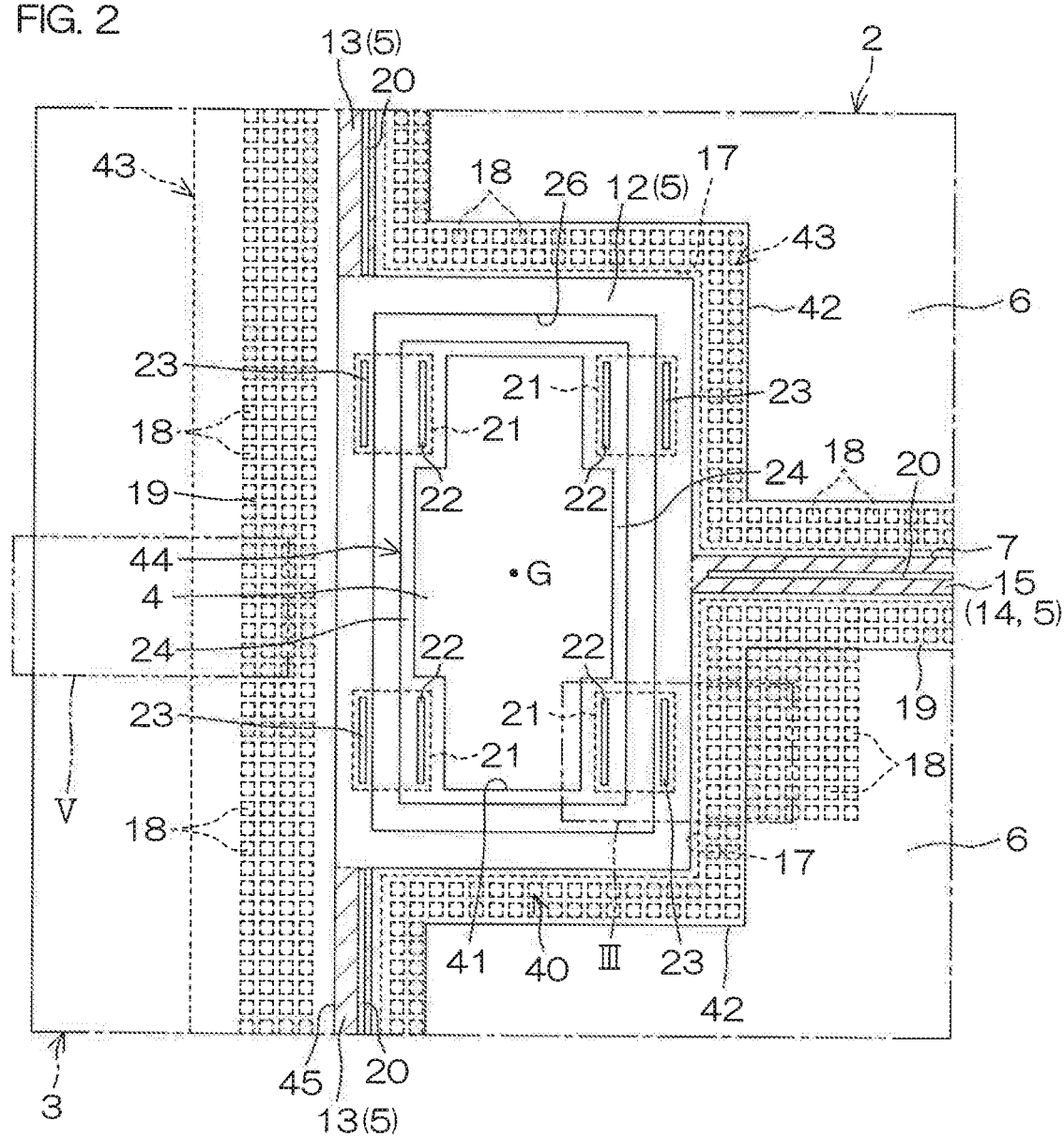
FIG. 2 is an enlarged view of a portion surrounded by a dashed-dotted line II in FIG. 1.

FIG. 2 is an enlarged view of a portion of FIG. 1 surrounded by a dashed-dotted line HI. That is, FIG. 2 shows an enlarged view of the gate pad 4 of the semiconductor device 1 and the region near the gate pad 4. Now, referring to FIG. 2, part of an element not exposed from the outer most surface of a semiconductor device 1 in actual plan view is shown in solid lines for the sake of clarity.

As shown in FIG. 2, a plurality of transistor cells 18 is arranged in the inner cell region 7 and the outer cell region 45 partitioned by the gate fingers 5 (pad periphery 12, first finger 13, and second finger 14).

In this embodiment, the plurality of transistor cells 18 is arranged in a matrix pattern in plan view in each inner cell region 7 and outer cell region 45. The plurality of transistor cells 18 is aligned in accordance with the shape of the gate finger 5 near the gate finger 5. For example, the plurality of transistor cells 18 is aligned to bend along the shape of corners of the pad periphery 12, and is linearly aligned in accordance with the shape of the linear base part 15 of the second finger 14. The source metal 43 is formed to cover the plurality of transistor cells 18.

In FIG. 2, part of the plurality of transistor cells 18 covered with the source metal 43 is shown for the sake of clarity. Further, the arrangement patterns of the plurality of transistor cells 18 may include not only a matrix pattern, but also, for example, a stripe pattern, a zigzag pattern and so forth. Also, the planar shape of each transistor cell 18 is not limited to a rectangular shape, but may include, for example, a circular shape, a triangular shape, a hexagonal shape and so forth.

A gate electrode 19 is formed between mutually adjacent transistor cells 18. The gate electrode 19 is arranged between each matrix array transistor cell 18 in the inner cell region 7 and the outer cell region 45, and formed as a whole in a lattice shape in plan view. Meanwhile, the gate electrode 19 is also formed in a region where the gate finger 5 is arranged, in addition to the inner cell region 7 and the outer cell region 45, and the portion under the gate finger 5 is in contact with the gate finger 5.

In this embodiment, part of the gate electrode 19 is formed under the first finger 13 and the second finger 14 to face the first finger 13 and the second finger 14 as a contact portion. In FIG. 2, the part of the gate electrode 19 formed thereunder is shown as a hatched region for the sake of clarity. Thereby, the mutually adjacent gate electrodes 19 in the inner cell region 7 are consecutively formed through the gate electrode 19 crossing under the second finger 14. The consecutive formation of the gate electrode 19 may be also applied to the formation between the inner cell region 7 and the outer cell region 45 across the gate metal 44. That is, the gate electrode 19 of these regions is consecutively formed through the gate electrode 19 crossing under the first finger 13.

The first finger 13 and the second finger 14 are each connected to the gate electrode 19 arranged thereunder through a gate contact 20. The gate contact 20 is linearly formed along each longitudinal direction of the first finger 13 and the second finger 14 in the center portion of the finger spaced apart from each side edge of the first finger 13 and the second finger 14.

Further in this embodiment, a plurality of embedded resistors 21 is arranged under the gate metal 44. The plurality of embedded resistors 21 is arranged at positions substantially equidistant from the center of gravity of the planar shape gate metal 44, and thereby the plurality of embedded resistors 21 can be preferably arranged in symmetrical pattern. In this embodiment, each of the plurality of embedded resistors 21 is positioned at each corner of the gate metal 44 rectangularly shaped in plan view, the embedded resistors 21 thereby being arranged equidistantly from the gravity center G of the gate metal 44. As such four embedded resistors 21 are formed into a symmetrical shape.

Such symmetrical patterns can be created in various ways. For example, each embedded resistor may be positioned at two diagonal corners of the gate metal 44, or may be positioned at two mutually opposite sides of the gate metal 44 so as to face each other. Further, for example, when the gate metal 44 has a circular shape in plan view, each of two embedded resistors may be positioned at both ends across the diameter of the gate metal 44, or when the gate metal 44 has a triangular shape in plan view, each of three embedded resistors may be positioned at the three corners of the gate metal 44.

Each embedded resistor 21 is formed to extend across an annular gap region 26 between the gate metal 44 and the gate finger 5 (pad periphery 12). Thereby, the embedded resistor 21 faces each of the gate metal 44 ad the gate finger 5. The gate metal 44 and the gate finger 5 (pad periphery 12) are connected to the embedded resistor 21 arranged in the region thereunder through a pad contact 22 and a cell contact 23.

In this embodiment, the four embedded resistors 21 extend outward orthogonal to two mutually opposite sides of the gate metal 44 from a portion under each peripheral edge 24 of the gate metal 44 along the two mutually opposite sides to a portion under the pad periphery 12. Each embedded resistor 21 is formed into a rectangular shape in plan view, and has a size of 200 µm □ or less (200 µm×200 µm or less). Practically, if the size of each embedded resistor 21 is 200 µm □ or less, the area of a region sacrificed by the embedded resistor 21 can be reduced in the area on the SiC epitaxial layer 28 (see FIG. 4), and thus space saving can be achieved.

Further, the pad contact 22 and the cell contact 23 are respectively formed in straight lines parallel to each other along the sides of the gate metal 44 and the pad periphery 12.

The gate pad 4 is secured at the central portion of the gate metals 44 as a wire region surrounded by the embedded resistors 21 by placing the embedded resistors 21 at positions excluding the central portion under the peripheral edge 24 of the gate metal 44 and covering the regions over the regions where the gate metals 44 are placed with the passivation film 40. The gate pad 4 is a region to which a bonding wire is connected.

That is, in this embodiment, each corner of the gate metal 44 where the embedded resistors 21 are placed is selectively covered with the passivation film 40, and thereby other portions of the gate metal 44 are exposed through the opening 41. Thereby, the gate pad 4 having a rectangular shape in plan view with each inwardly recessed corner is exposed from the outermost surface of the semiconductor device 1. In this way, the upper portion of the region where the embedded resistors 21 are arranged is covered with the passivation film 40, and thus the bonding wire can be prevented from being incorrectly bonded onto a portion of the gate metal 44 overlapping the embedded resistors 21 during the bonding of the bonding wire. As a result, the semiconductor device 1 according to this embodiment can prevent the embedded resistors 21 from being damaged or destroyed due to ultrasonic impact and so forth during the bonding of the bonding wire.

Figure 3:
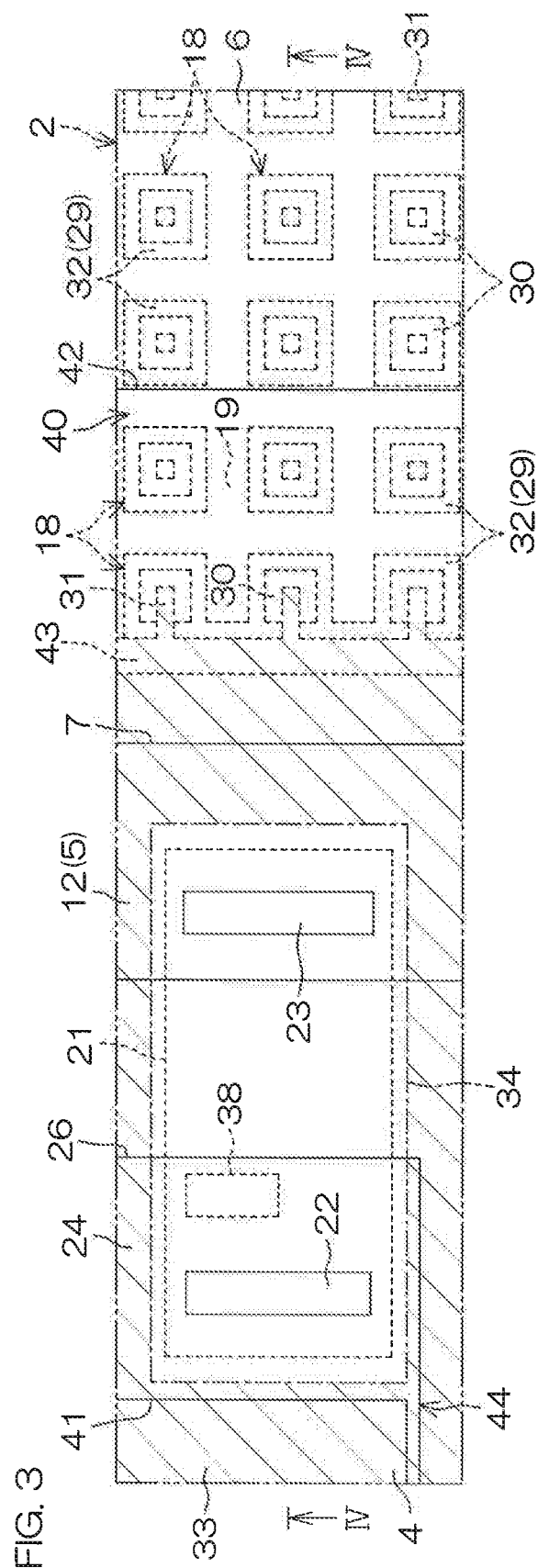
FIG. 3 is an enlarged view of a portion surrounded by a dashed-two dotted line II in FIG. 2.
Figure 4:
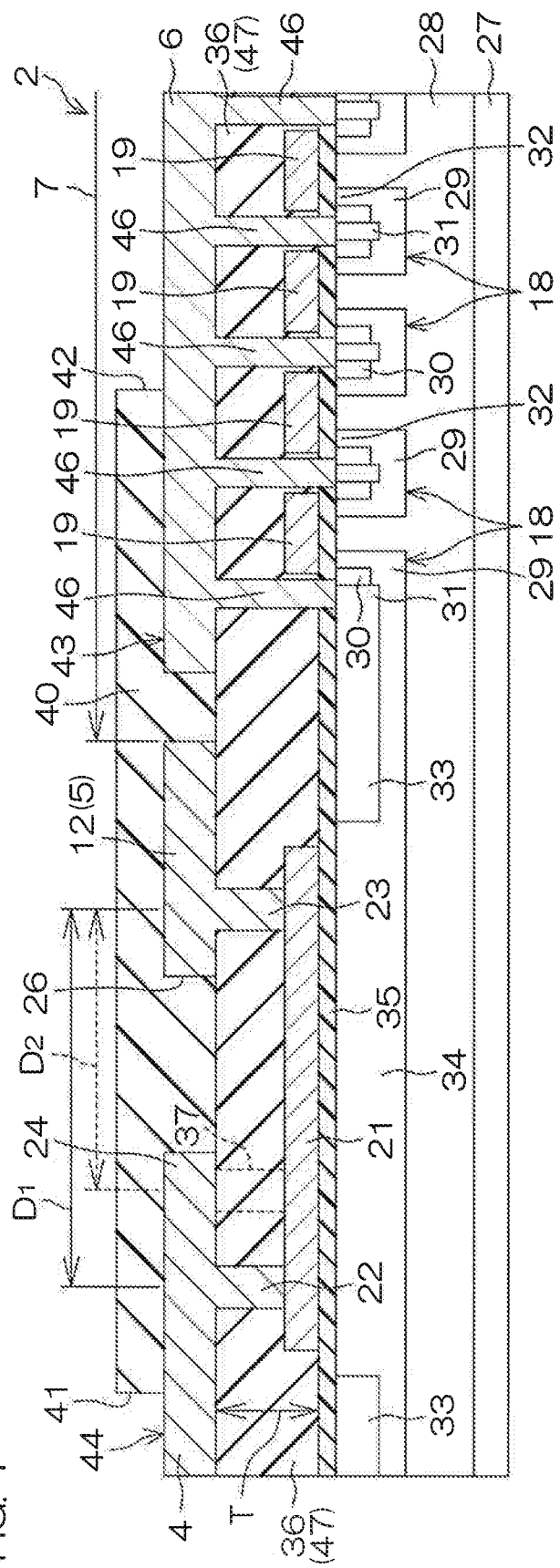
FIG. 4 is a cross-sectional view of the semiconductor device taken along a line IV-IV shown in FIG. 3.

FIG. 3 is an enlarged view of a portion surrounded by a dashed-two dotted line III in FIG. 2. FIG. 4 is a cross-sectional view of the semiconductor device taken along a line IV-IV shown in FIG. 3. The scale size of each composing element in FIGS. 3, 4 can be different from those in FIGS. 1, 2 for the sake of clarity, and similarly the scale size of each composing element can be different between FIG. 3 and FIG. 4. Further, the elements not actually exposed from the outermost surface of the semiconductor device 1 are partly shown in solid lines in FIGS. 3 and 4 for the sake of clarity.

Next, more specific structure of the embedded resistors 21 and the nearby region thereof will be described referring to the sectional view of the semiconductor device 1.

The semiconductor device 1 includes a SiC substrate 27 and a SiC epitaxial layer 28. The SiC epitaxial layer 28 is laminated on the SiC substrate 27, and this laminate structure is shown as an example of the SiC layer according to the present invention.

The SiC substrate 27 and the SiC epitaxial layer 28 are $n^+$ type and $n^-$ type SiCs, respectively. The impurity concentration of an $n^+$ type SiC substrate 27 is, for example, $1\times10^{17}$ $cm^{-3}$ to $1\times10^{21}$ $cm^{-3}$. Meanwhile, the impurity concentration of the $n^-$ type SiC epitaxial layer 28 is, for example, $1\times10^{14}$ $cm^{-3}$ to $1\times10^{16}$ $cm^{-3}$. Further, for example, nitrogen (N), phosphorus (P), arsenic (As) and so forth can be used as n-type impurities (the same applies hereinafter).

Further, the thickness of the SiC substrate 27 is, for example, 50 μm to 1000 μm, and the thickness of the SiC epitaxial layer 28 is, for example, 5 μm or greater (specifically 5 μm to 100 μm).

A plurality of transistor cells 18 is formed on the surface of the SiC epitaxial layer 28 in the inner cell region 7. The plurality of transistor cells 18 includes a $p^-$ type body region 29, an $n^+$ type source region 30 selectively formed in the inner portion of the $p^-$ type body region 29 spaced apart from the peripheral edge of the $p^-$ type body region 29, and a $p^+$ type body contact region 31 selectively formed in the inner portion of the $n^+$ type source region 30 spaced apart from the peripheral edge of the $n^+$ type source region 30. Further, the $n^-$ type portion of the SiC epitaxial layer 28 serves as a common drain region for the plurality of transistor cells 18.

As show in FIG. 3, when planarly viewed, the $n^+$ type source region 30 is formed to surround the $p^+$ type body contact region 31 except the transistor cells 18 along the pad periphery 12 (gate finger 5) and the $p^-$ type body region 29 is formed to surround the $n^+$ type source region 30. The annular region of the $p^-$ type body region 29 surrounding the $n^+$ type source region 30 is a channel region 32 where a channel is formed when the semiconductor device 1 is turned on.

Meanwhile, in the transistor cells 18 along the pad periphery 12 (gate finger 5), the $p^-$ type body region 29 and the $p^+$ type body contact region 31 are electrically connected to the later described $p^-$ type region 34 and $p^+$ type region 33, respectively.

The impurity concentration of the $p^-$ type body region 29 is, for example, $1\times10^{14}$ $cm^{-3}$ to $1\times10^{19}$ $cm^{-3}$; the impurity concentration of the $n^+$ type source region 30 is, for example, $1\times10^{17}$ $cm^{-3}$ to $1\times10^{21}$ $cm^{-3}$; and the impurity concentration of the p type body contact region 31 is, for example, $1\times10^{19}$ $cm^{-3}$ to $1\times10^{21}$ $cm^{-3}$.

When forming these regions 29 to 31, for example, the $p^-$ type body region 29 is formed by ion injection in the surface part of the SiC epitaxial layer 28. Thereafter, n-type impurity ions and p-type impurity ions are injected into the surface part of the $p^-$ type body region 29 in this order, and thereby the $n^+$ type source region 30 and the p type body contact region 31 are formed. In this way, the transistor cells 18 composed of the regions 29 to 31 are formed. For example, boron (B), aluminum (Al) and so forth can be used as p-type impurities (the same applies hereinafter).

The $p^-$ type region 34 is formed in the surface part of the SiC epitaxial layer 28 in the regions except for the inner cell region 7 and the outer cell region 45, more specifically in the regions under the gate metal 44, the gate finger 5, and the gap region 26 of the active region 2. The $p^+$ type region 33 is formed in the surface part of the $p^-$ type region 34.

The $p^+$ type region 33 is formed to extend almost over the entire surface of the regions under the gate metal 44 and so forth so as to selectively expose the $p^-$ type portion of the $p^-$ type region 34 on the SiC surface in the region facing the embedded resistors 21 in the SiC epitaxial layer 28 while selectively exposing the $p^+$ type portion of the $p^+$ type region 33 on the SiC surface in the rest of regions in the SiC epitaxial layer 28. That is, the gate metal 44 and the gate finger 5 face the $p^-$ type portion in the region where the embedded resistors 21 are placed, but the most part of the gate metal 44 and the gate finger 5 face the $p^+$ type portion in the other region. Further, the $p^+$ type region 33 and the $p^-$ type region 34 are each formed to extend to the region under the source metal 43, and are integrally connected to the $p^+$ type body contact region 31 and the p− type body region 29 under the source metal 43 (outer portion of the source pad 6 in this embodiment). In FIG. 3, the p+ type body contact region 31 and the p+ type region 33 of the transistor cells 18 along the pad periphery 12 (gate finger 5) are shown by the hatched region. The p+ type body contact region 31 is practically fixed at the ground potential together with the source metal 43 to thereby stabilize the p+ type region 33 at 0 V. For this reason, the most part of the gate metal 44 and the gate finger 5 preferably face the $p^+$ type portion 33 as shown in this embodiment.

The $p^+$ type portion 33 and the $p^-$ type region 34 are each formed in the same process as the $p^+$ type body contact region 31 and the $p^-$ type body region 29, and these are the same in impurity concentration and depth.

A gate insulating film 35 is formed on the surface of the SiC epitaxial layer 28. The gate insulating film 35 is composed of an insulating material such as silicon oxide, and has a thickness of, for example, 0.001 μm to 1 μm. The gate insulating film 35 is a common insulating film for insulating the gate electrode 19 and the embedded resistors 21 from the SiC epitaxial layer 28.

The gate electrode 19 and the embedded resistors 21 are formed on the gate insulating film 35. The gate electrode 19 is formed to face the channel region 32 of each transistor cell 18 across the gate insulating film 35. Whereas, the embedded resistors 21 are formed to face the exposed $p^-$ portion of the $p^-$ type region 34 across the gate insulating film 35.

Both the gate electrode 19 and the embedded resistors 21 are formed are made of p-type polysilicon, and may be formed in the same process. In this embodiment, the gate electrode 19 and the embedded resistors 21 include boron (B) as p-type impurities. Boron (B) doped polysilicon (embedded resistors 21) has a large value of specific electrical resistance compared to phosphorus (P) doped polysilicon generally used in a Si semiconductor device. As such, the boron (B) doped polysilicon (embedded resistors 21) can create the same value of resistance as the phosphorus (P) doped polysilicon with a smaller area than that of the phosphorus (P) doped polysilicon. Therefore, the area occupied by the embedded resistors 21 on the SiC epitaxial layer 28 can be decreased to effectively use the space.

The concentration of the p-type impurities contained in the polysilicon may be changed as necessary in accordance with each designed value of resistance of the gate electrode 19 and the embedded resistor 21. The concentration is set in this embodiment so that the sheet resistance of the embedded resistor 21 is greater than or equal to 10Ω/□. The resistance value of the embedded resistor 21 as a whole can be easily made greater than the variation in resistance values among a plurality of semiconductor devices 1 without increasing the area of the embedded resistor 21 provided that the sheet resistance of the embedded resistor 21 is greater than or equal to 10Ω/□. For example, if the variation in resistance values is between 0.1Ω and 20Ω, inclusive, the resistance value of the embedded resistor 21 can be easily made between 2Ω and 40Ω, inclusive with a smaller area. As a result, the area of a region sacrificed by the embedded resistor 21 can be reduced in the area on the SiC epitaxial layer 28, and thus other elements can be laid out without being much affected by the area of the embedded resistor 21. In this case, the total resistance value of the gate electrode 19 and the embedded resistor 21 is preferably between 4Ω and 50Ω, inclusive.

The thickness of the gate electrode 19 and the embedded resistor 21 is preferably 2 μm or less. The whole resistance of the embedded resistor 21 can be easily made greater than the variation in resistance values among a plurality of semiconductor devices 1 by making the thickness of the embedded resistor 21 less than or equal to 2 μm. On the contrary, if the embedded resistor 21 is too much thick, the resistance value thereof unpreferably decreases greatly.

Further, an insulating film 47 is formed on the SiC epitaxial layer 28. The insulating film 47 is composed of an insulating material such as silicon oxide ($SiO_2$) and silicon nitride (SiN), and has a thickness of 1 μm to 5 μm. Particularly, boron phosphorus silicon glass (BPSG) film having a thickness of 1 μm or greater is preferably used.

The insulating film 47 includes an interlayer film 36 formed to cover the gate electrode 19 and the embedded resistor 21. The interlayer film 36 is formed to enter a region (first region) where the gate electrode 19 and the embedded resistor 21 are not placed in the region on the gate insulating film 35. Thereby, the distance (thickness T of insulating film) between the SiC epitaxial layer 28 and the gate metal 44 can be made greater in the region where the embedded resistor 21 is not placed, and thus the capacitance therebetween can be reduced.

The pad contact 22 and the cell contact 23 are formed to pass through the interlayer film 36. The pad contact 22 and the cell contact 23 are made of a metal via integrally formed with the gate metal 44 and the gate finger 5 (pad periphery 12).

Further, a source contact 46 is formed to pass through the interlayer film 36 so that the $p^+$ body contact region 31 is in contact with the source metal 43. The source contact 46 is made of a metal via integrally formed with the source metal 43.

The gate metal 44, the gate finger 5, and the source metal 43 are formed on the interlayer film 36 spaced apart from each other.

The passivation film 40 is formed on the interlayer film 36 to cover the gate metal 44 the gate finger 5, and the source metal 43. The passivation film 40 is provided with openings 41, 42 to partly expose the gate metal 44 and the source metal 43.

As described above, the polysilicon resistor (embedded resistor 21) is interposed between the gate metal 44 the gate finger 5 as shown in FIG. 3 and FIG. 4 according to the semiconductor device 1. That is, the embedded resistor 21 is provided in the middle of a current path from the outside to the plurality of the transistor cells 18.

The resistance value of the embedded resistor 21 can be made dominant in the total resistance value (resistance value of gate resistor) of the gate electrode 19 and the embedded resistor 21 by adjusting the resistance value of the embedded resistor 21. Therefore, a current is prevented from flowing into a semiconductor device 1 in which the gate electrode 19 has a relatively low resistance value by setting the resistance value of the embedded resistor 21 greater than the variation in resistance values of the gate electrodes 19 even when using a plurality of parallel-connected semiconductor devices 1 with the gate electrodes 19 having the variation in resistance values. As a result, noise can be reduced when using such semiconductor devices 1.

Moreover, polysilicon composing the embedded resistor 21 is a material whose resistance value is easily changed by the injection of impurities. The processing technique for polysilicon has also been established in the conventional semiconductor technology. As such, when adopting the embedded resistor 21, the polysilicon as the material thereof prevents the structure of the semiconductor 1 itself and a module provided with the semiconductor 1 from becoming complex.

Similarly to the gate electrodes 19, although variation may take place in the size and the thickness of the embedded resistor 21 due to the variation in the processing accuracy (etching dimension and so forth) when manufacturing the semiconductor device 1, the processing dimension is smaller than the gate electrode 19. Therefore, the variation in the embedded resistors 21 hardly triggers the occurrence of noise.

The embedded resistor is connected to the gate metal 44 at the lower portion of the gate metal 44, and thus a gate current flowing into the current path continuing from the outside to the plurality of the transistor cells 18 can be controlled at the entrance of the current path. Thereby, a rush current can be prevented from flowing in only a specific transistor cell 18.

For example, in FIG. 2, when it is assumed that the embedded resistor 21 is formed as a bypass for the first finger 13 and the second finger 14 in the middle of the fingers 13, 14 of the gate finger 5, a rush current may flow in the gate electrode 19 through the gate contact 20 from the fingers 13, 14 before reaching the embedded resistor 21 in the side closer to the gate metal 44 than the embedded resistor 21. In contrast, given that a gate current can be controlled at the entrance of the current path as shown in this embodiment, the variation in switching speeds among a plurality of the transistor cells can be reduced.

Further, as shown in FIG. 2, the embedded resistors 21 are symmetrically arranged. The feature of this arrangement also helps to reduce the variation in switching speeds among a plurality of transistor cells 18.

Further, as shown in FIGS. 3 and 4, the region facing the embedded resistor 21 in the SiC epitaxial layer 28 is the p type region 34 having the impurity concentration of $1 \times 10^{19}$ $cm^{-3}$ or less. Thereby, the dielectric breakdown of the gate insulating film 35 can be favorably suppressed. Further, a $p^-$ type region can hardly store carriers compared to a n-type region, and thus the capacitance of the region between the embedded resistor 21 and the $p^-$ type region 34 facing each other across the gate insulating film 35 can be also reduced.

Further as shown in FIGS. 3 and 4, the gate metal 44 and the embedded resistor 21 are connected by the pad contact 22 made of the metal via. With this configuration, the resistance value which the embedded resistor 21 gives to the current path from the outside to the plurality of transistor cells 18 can be easily adjusted by the process of changing the position of the pad contact 22 along the surface of the SiC epitaxial layer 28 or the process of changing the diameter of the via, and so forth.

For example, only by moving the pad contact 22 toward the pad periphery 12 like a pad contact 37 shown in a dashed line in FIG. 4, a distance from a position of the pad contact in contact with the embedded resistor 21 to the pad periphery 12 can be easily decreased from $D_1$ to $D_2$. Thereby, the resistance value of the embedded resistor 21 can be reduced. To the contrary, if the position of the pad contact is moved away from the pad periphery 12, the resistance value of the embedded resistor 21 can be increased. Alternatively, only by decreasing the via diameter compared to the pad contact 22 like a pad contact 38 shown in dashed line in FIG. 3, the resistance value of the current path directed to the embedded resistor 21 can be increased. To the contrary, if the via diameter is increased, the resistance value of the current path can be reduced.

Furthermore, these processes can be carried out only by using a mask adapted to distance design or via diameter design when forming the pad contact 22 (via), and thus the manufacturing process can be prevented from becoming complex.

Figure 5:
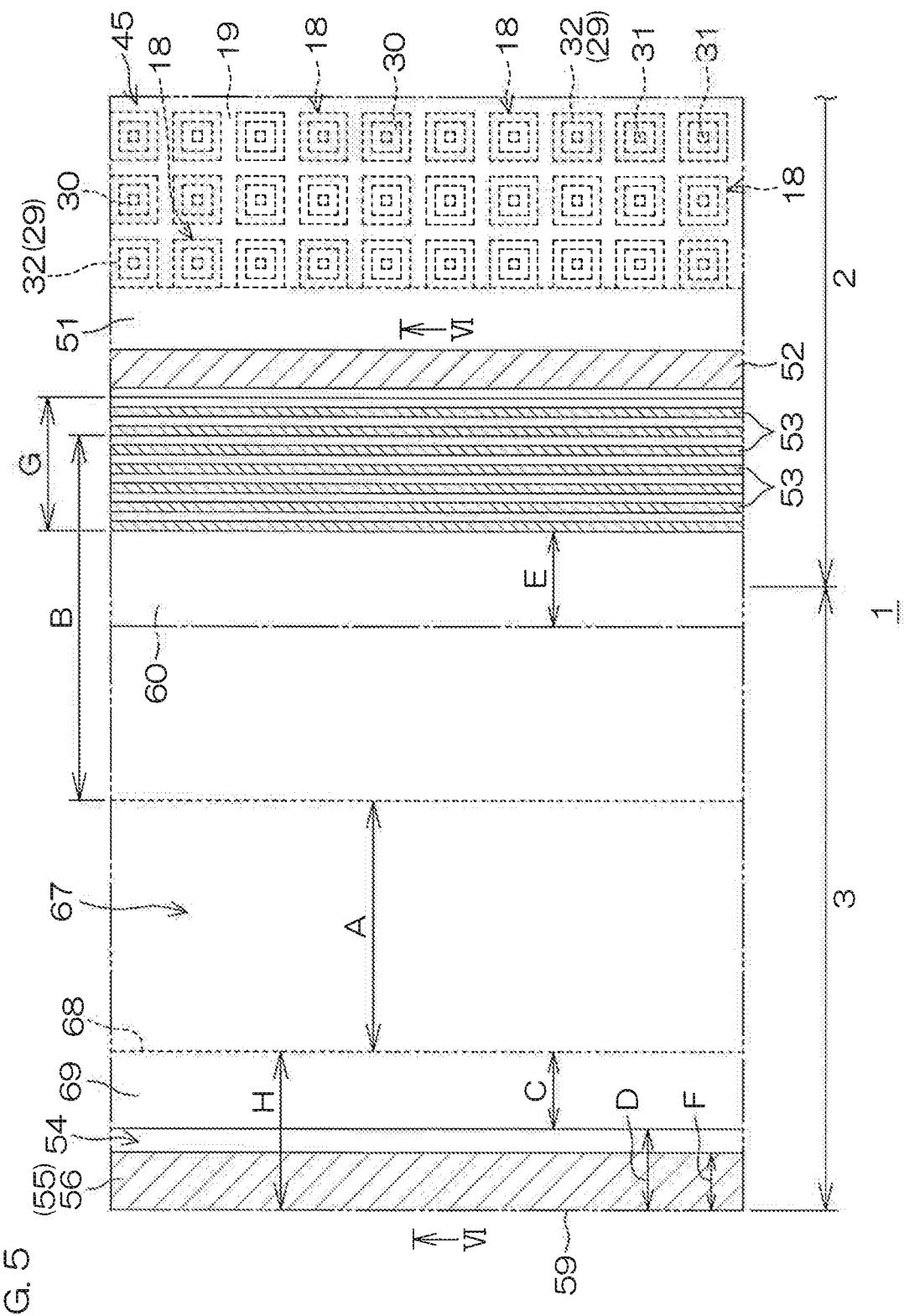
FIG. 5 is an enlarged view of a region surrounded by a dashed-two dotted line V in FIG. 2.
Figure 6:
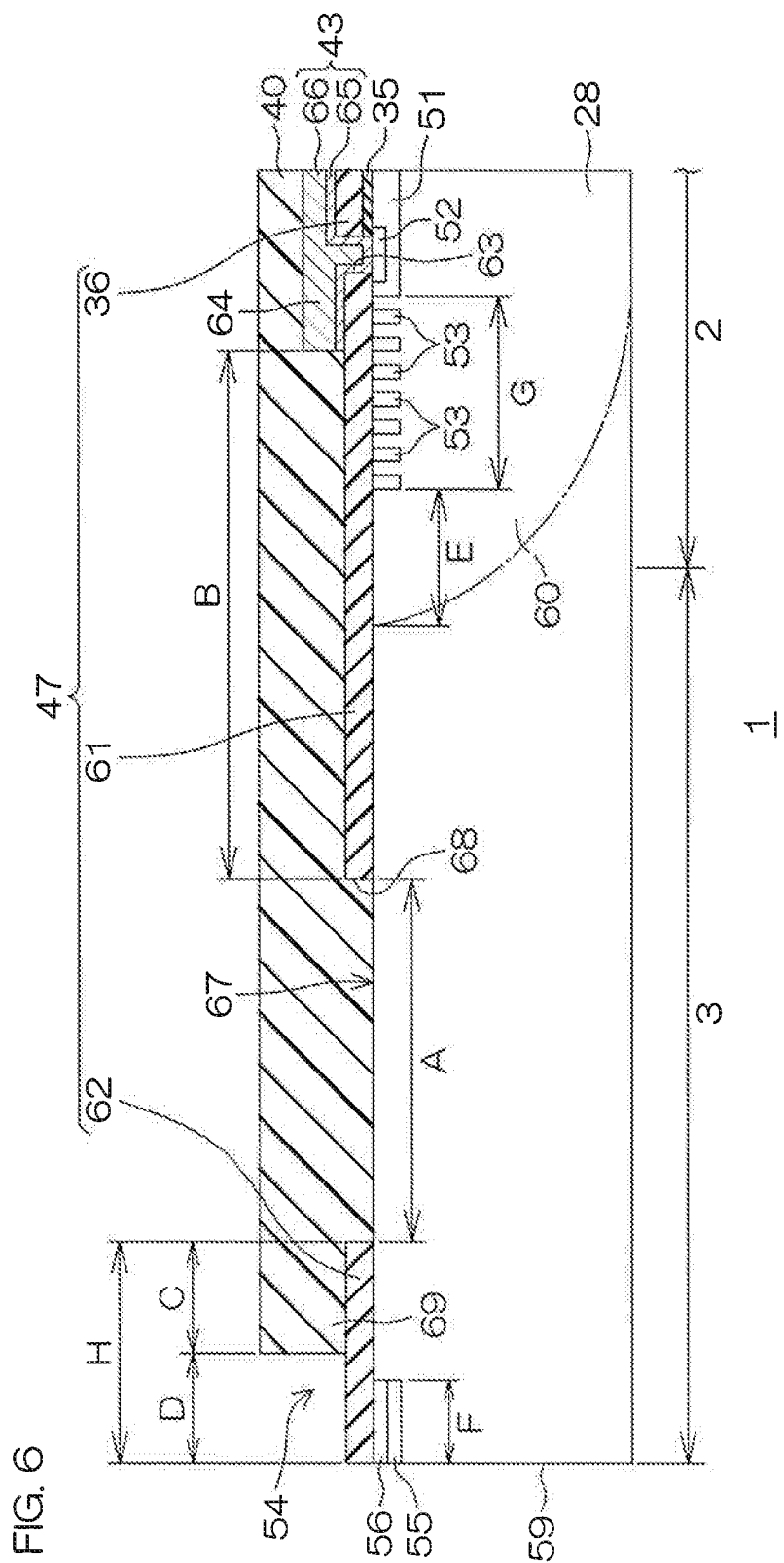
FIG. 6 is a cross-sectional view of the semiconductor device taken along a line VI-VI shown in FIG. 5.

FIG. 5 is an enlarged view of a region surrounded by a dashed-two dotted line V in FIG. 2. FIG. 6 is a cross-sectional view of the semiconductor device taken along a line VI-VI shown in FIG. 5. The scale size of each composing element in FIGS. 5 and 6 can be different from those in FIGS. 1 to 4 for the sake of clarity, and similarly the scale size of each composing element can be different between FIG. 5 and FIG. 6. Further, the elements not actually exposed from the outermost surface of the semiconductor device 1 are partly shown in solid lines in FIGS. 5 and 6 for the sake of clarity.

Next, the more specific structure of the peripheral edge and the outer peripheral region 3 of the active region 2 of the semiconductor device 1 is described together with the cross-sectional structure of the semiconductor device 1.

As previously described, a plurality of the transistor cells 18 is arrayed in matrix in plan view in the outer cell region 45 formed in the peripheral edge of the active region 2. Each transistor cell 18 is configured similarly to the structure described referring to FIG. 3 and FIG. 4.

A $p^-$ type region 51 is formed in the surface part of the SiC epitaxial layer 28 outside the outer cell region 45. A $p^+$ type region 52 is formed in the surface part of the $p^-$ type region 51. The $p^-$ type region 51 is linearly formed along the peripheral edge of the active region 2 and integrally formed with the $p^-$ type body region 29 of the plurality of the outermost transistor cells 18. Only part of the $p^-$ type region 51 next to the outer cell region 45 is shown in FIG. 5, but the $p^-$ type region 51 may surround the cell region (the inner cell region 7 and the outer cell region 45) along the whole circumference of the active region 2. The $p^+$ type region 52 is linearly formed to longitudinally extend in the inner region of the p type region 51 (the region spaced apart from the peripheral edge of the $p^-$ type region 51). The $p^-$ type region 51 and the $p^+$ type region 52 are formed in the same process as the $p^-$ type body region 29 and the $p^+$ type body contact region 31, respectively, and the impurity concentration and the depth are also the same.

A plurality of guard rings 53 as an example of the termination structure of the present invention is formed to surround the cell region (the inner cell region 7 and the outer cell region 45) along the peripheral edge of the active region 2. The plurality of guard rings 53 is arranged in a guard ring region which has a given width (G) from the outermost region (the p type region 51 in this embodiment) of the regions set to the same potential as the source metal 43 in the SiC epitaxial layer 28. The given width (G) is 5 μm to 100 μm in this embodiment (for example, 28 μm). When the guard rings 53 are formed in the same process as the $p^-$ type body region 29, the impurity concentration and the depth are also the same. When formed in other processes, the impurity concentration is, for example, $1 \times 10^{14}$ cm$^{-3}$ to $1 \times 10^{19}$ cm$^{-3}$, and the depth is 0.1 μm to 2 μm.

Meanwhile, in the outer peripheral region 3, a $p^-$ type region 55 is formed in the surface part of the SiC epitaxial layer 28, and a $p^+$ type region 56 is formed in the surface part of the $p^-$ type region 55. The $p^-$ type region 55 and the $p^+$ type region 56 are formed in the same process as the $p^-$ type body region 29 and the $p^+$ type body contact region 31 similarly to the $p^-$ type region 51 and the $p^+$ type region 52 (the impurity concentration and the depth are the same). However, the $p^-$ type region 55 and the $p^+$ type region 56 has a laminate structure wherein the $p^+$ type region 56 is formed over the entire surface of the $p^-$ type region 55.

Figure 7A:
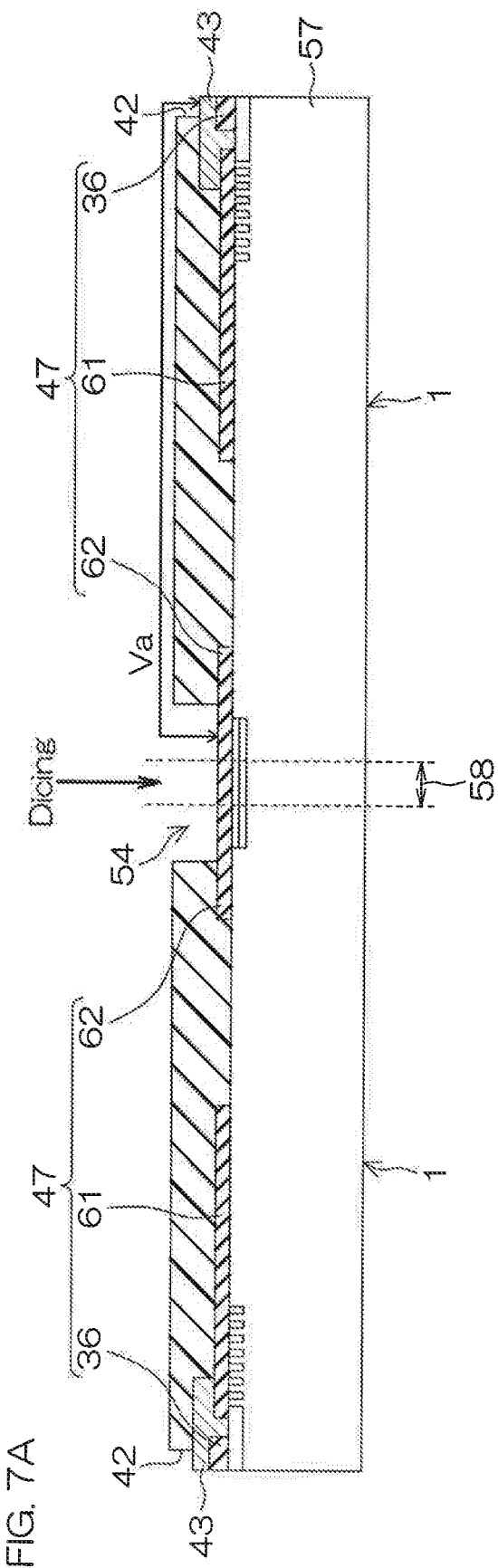
FIG. 7A is a cross-sectional view illustrating a step associated with wafer cutting.

The $p^-$ type region 55 and the $p^+$ type region 56 are positioned in a dicing region 54 provided at the end of the SiC epitaxial layer 28. The dicing region 54 is a region having a given width including a dicing line 58, which is provided at the boundary between adjacent semiconductors 1 on a wafer 57 as shown in FIGS. 7A and 7B. The wafer 57 is diced into individual semiconductor devices 1 by cutting along the dicing line 58. In this process, a predetermined marginal width needs to be provided by taking the positional displacement of a dicing saw into account, and this marginal portion remains as the dicing region 54 after the dicing process.

The $p^-$ type region 55 and the $p^+$ type region 56 are arranged to be exposed from the end surface 59 of the SiC epitaxial layer 28 in the dicing region 54. The width (F) of the $p^-$ type region 55 and the $p^+$ type region 56 with reference to the exposed surface (an end surface 59) is 5 μm to 100 μm (for example, 20 μm) in this embodiment. This width (F) may be set, for example, within the range greater than or equal to the difference between the width (D) of the dicing region 54 and a width which is twice as large as the width (E) of a depletion layer 60 extending from the guard ring 53. In designing the width (F), the width (D) of the dicing region 54 may use the distance (for example, 13 μm) from the end surface 59 of the SiC epitaxial layer 28 to the end edge of the passivation film 40 in this embodiment. Meanwhile, the width (E) of the depletion layer 60 may use a value calculated by the following expression (1):

[Formula 1]

$$\text{Width } (E) = W \ (\mu m) = \sqrt{\frac{2\varepsilon_s V_{bi}}{qN_B}} \quad (1)$$

Where, $\varepsilon_s$ represents a dielectric constant; $V_{bi}$ represents a built-in potential in the pn junction between the p-type guard ring 53 and the n-type SiC epitaxial layer 28; q represents the absolute value of the charge; and $N_B$ represents the donor concentration of the n-type SiC epitaxial layer 28.

The insulating film 47 further includes an insulating film under metal 61 as an example of the insulating film under electrode according to the present invention and an end insulating film 62 in addition to the interlayer film 36. The insulating film 47 is provided with a contact hole 63 for exposing the p+ type region 52. The inner portion of the contact hole 63 as a boundary is the interlayer film 36, which is formed on the gate insulating film 35. The outer portion adjacent to the interlayer 36 across the contact hole 63 is the insulating film under metal 61.

The source metal 43 is connected the p+ type region 52 through the contact hole 63. Further, the source metal 43 has an overlap portion 64 extending laterally outside to overlap the insulating film under metal 61. The overlap portion 64 faces the guard ring 53 across the insulating film under metal 61. In this embodiment, the overlap portion 64 is provided to partly covers the region where the guard ring 53 is formed (guard ring region having the width (G)) and the end thereof is arranged inside the outer end of the guard ring region. Although the overlap portion 64 may cover the whole of the guard ring region, the position of the end is determined so that a distance (B) shown in FIG. 6 is 40 µm or greater (for example, 45 µm to 180 µm). The distance (B) represents the lateral length of the source metal 43 on the insulating film under metal 61 and the SiC epitaxial layer 28. In this embodiment, the distance (B) is the length from the end edge of the overlap portion 64 to the end edge of t. Further, the distance (B) may be at least two times greater than the width (E) of the depletion layer 60.

Further, as previously described, the source metal 43 is preferably composed of a laminate structure represented by Ti/TiN/Al—Cu. For example, in this embodiment, the source metal 43 includes Ti/TiN film 65 (barrier film) and an Al—Cu film 66 laminated in that order from the side of the SiC epitaxial layer 28. The Ti/TiN film 65 and the Al—Cu film 66 are not shown in FIG. 4.

An n-type region 67 (a region of a first conductivity type) is formed outside the insulating film under metal 61 to expose the SiC surface of the SiC epitaxial layer 28 over a distance (A). The n-type region 67 is part of the SiC epitaxial layer 28 exposed through an opening 68 formed outside the insulating film under metal 61 (between the insulating film under metal 61 and the end insulating film 62 in this embodiment). As shown in FIG. 5, for example, the opening 68 is linearly formed along the boundary between the active region 2 and the outer peripheral region 3. The distance (A) of the n-type region 67 is greater than 40 µm (for example, 45 µm to 180 µm), however, a total of the distances (A) and (B) is preferably 180 µm or less. By setting the total distance of the distance (A) and the distance (B) to 180 µm or less, the chip size of the semiconductor device 1 can be kept within favorable sizes.

The end insulating film 62 is formed so as to cover the dicing region 54 of the SiC epitaxial layer 28. Specifically, the end insulating film 62 laterally extends from the end surface 59 of the SiC epitaxial layer 28 to the inner region beyond the dicing region 54. In this embodiment, the width (H) of the end insulating film 62 with reference to the end surface 59 is 10 µm to 105 µm (for example, 22 µm). Thereby, the p− type region 55 and the p+ type region 56 (p-type regions) are covered with the end insulating film 62.

As with the insulating film 47, the passivation film 40 is an example of the insulator according to the present invention, and is made of an organic insulator. The usable organic insulators include, for example, a polyimide-based material, a polybenzoxazole-based material, and an acrylic-based material. That is, in this embodiment, the passivation film 40 is constituted as an organic passivation film. Further, the thickness of the passivation film 40 is, for example, 0.2 µm to 20 µm.

The passivation film 40 is formed to cover the insulating film 47. In this embodiment, the passivation film 40 is formed to cover almost all the SiC epitaxial layer 28 except for the end thereof (in other words, the dicing region 54 is partitioned by the passivation film 40). Therefore, the passivation film 40 is in contact with the n-type region 67 of the SiC epitaxial layer 28 in the opening 68 of the insulating film 47 over the distance (A) of 40 µm or greater.

The passivation film 40 does not cover the end of the SiC epitaxial layer 28, but has an overlap portion 69 that partly overlaps the end insulating film 62. The SiC surface of the SiC epitaxial layer 28 is prevented from being exposed to the outside by this overlap portion 69. Further, the overlapped width (C) formed by the overlap portion 69 and the end insulating film 62 is 5 µm or greater (for example, 9 µm) in this embodiment. Further, in this embodiment, the overlap portion 69 is formed inwardly away from the p-type region (the p− type region 55 and the p+ type region 56) in plan view. Thereby, the overlapped portion 69 faces the n-type portion of the SiC epitaxial layer 28 across the end insulating film 62, and does not face the p-type region.

As described above, according to the semiconductor device 1, the distance (A) is 40 µm or greater as shown in FIGS. 5 and 6, and thus the contact area between the organic passivation film 40 and the SiC epitaxial layer 28 (n-type region 67) can be sufficiently secured. Thereby, the adhesion of the organic passivation film 40 to the SiC epitaxial layer 28 can be improved. In addition, the distance (B) is 40 µm or greater, or at least two times greater than the width (E) of the depletion layer 60, and thus can withstand a high-temperature, high-humidity, high-voltage test (for example, 85° C., 85% RH, and an applied voltage of 960V for 1000 consecutive hours). Setting the distance (A) and the distance (B) to the above described range is a quite new finding in a SiC semiconductor device. In a SiC, since the expansion of a depletion layer in the horizontal direction is smaller than in a Si, conventionally a chip size did not need to be increased by extending the distance (A) and the distance (B). This is not only because the depletion layer 60 was unlikely to reach the end surface 59 of a chip even without increasing the chip size, but because an increase in chip size possibly caused a rise in on-resistance per a unit of chip area. Under this background, the inventors of this application found that the durability against a high-temperature/high-humidity/high-voltage tests could be improved by purposely extending the distance (A) and the distance (B) to 40 µm or greater.

Further in this embodiment, the p-type region (the p− type region 55 and the p+ type region 56) is formed in the SiC epitaxial layer 28, and the p-type region is covered with the end insulating film 62. As such, when testing the electrical characteristics of a semiconductor device 1 in a state of the wafer 57 before the dicing process shown in FIG. 7A, the burden of a voltage Va applied in the atmosphere between the dicing region 54 and the source metal 43 (the portion exposed through the opening 42) can be reduced.

When carrying out a test, for example, the source metal 43 of one semiconductor device 1 is set to 0 V and the rear surface of the wafer 57 is set to 1000 V or greater (for example, 1700 V). Thereby, a maximum application voltage (BV) is applied to generate a potential difference of 1000 V or greater between the source metal 43 and the wafer 57, and thereby a withstand voltage of each MOSFET is measured. At this time, since the n-type portion of the wafer 57 including part of the dicing region 54 (the portion excluding the p⁻ type region 55 and the p⁺ type region 56) is fixed at a potential of 1000 V or greater, a potential difference of 1000 V or greater is generated between the dicing region 54 and the source metal 43. Even in this case, the p-type region (the p⁻ type region 55 and the p⁺ type region 56) is formed along the dicing region 54 according to this embodiment, and the dicing region 54 is covered with the end insulating film 62. As such, the maximum application voltage (BV) of 1000 V or greater applied between the dicing region 54 and the source metal 43 can be moderated in two stages of the end insulating film 62 and the p-type region (the p type region 55 and the p⁺ type region 56). Thereby, the burden of a voltage Va applied in the atmosphere between the dicing region 54 and the source metal 43 can be reduced. As a result, the semiconductor device 1 having a breakdown voltage value (BV) of 1000 V or greater can be achieved.

Further, by setting the thickness of the insulating film under metal 61 to 1 μm or greater, insulation breakdown can be prevented even when a voltage of 1000 V or greater is applied to the insulating film under metal 61. Further, if the insulating film 47 is made of BPSG, it is possible to easily planarized the insulating film under metal 61 and the end insulating film 62 while rounding off and smoothing the corners of the insulating films 61, 62 by carrying out reflow soldering. As a result, the adhesion of the passivation film 40 to the insulating films 61, 62 can be improved.

Further, since the dicing region 54 is not covered with the passivation film 40, the semiconductor devices 1 in the state of the wafer 57b can be easily divided (diced) into individual semiconductor devices 1.

FIG. 8 to FIG. 14 are schematic cross-sectional views of a semiconductor device according to an embodiment of the present invention. The same reference numerals as those in claim 6 are applied to the mutually corresponding elements.

Next, in other embodiments according to the present invention, description will be made mainly to those different from the elements in the previously described semiconductor device 1.

Figure 8:
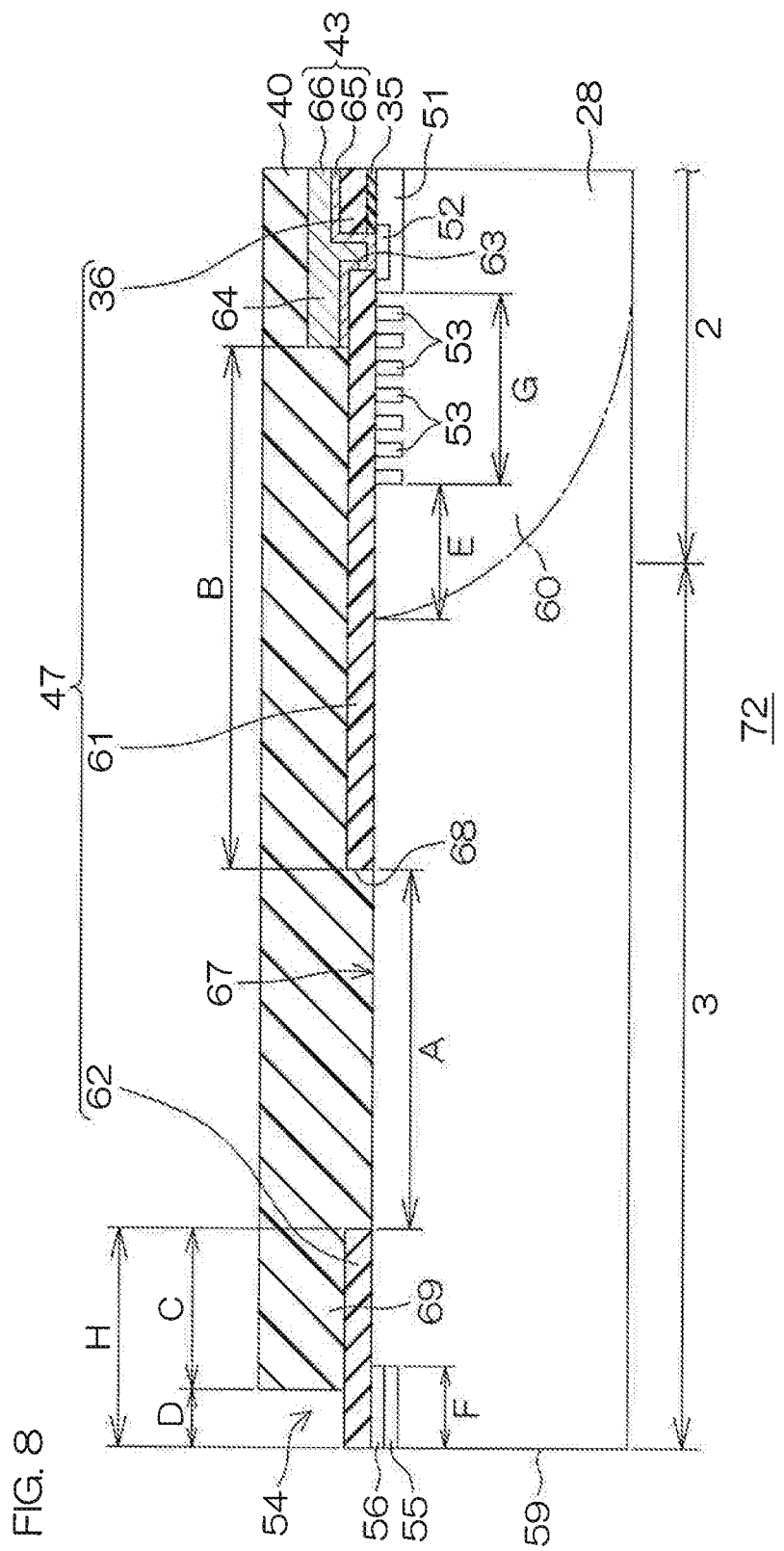
FIG. 8 is a schematic cross-sectional view of a semiconductor device according to an embodiment of the present invention.

In a semiconductor device 72 in FIG. 8, the overlap portion 69 of the passivation film 40 is selectively formed to cover the p-type region (the p⁻ type region 55 and the p⁺ type region 56) across the end insulating film 62. Thereby, the overlap portion 69 has a portion overlapped by the p-type region.

Figure 9:
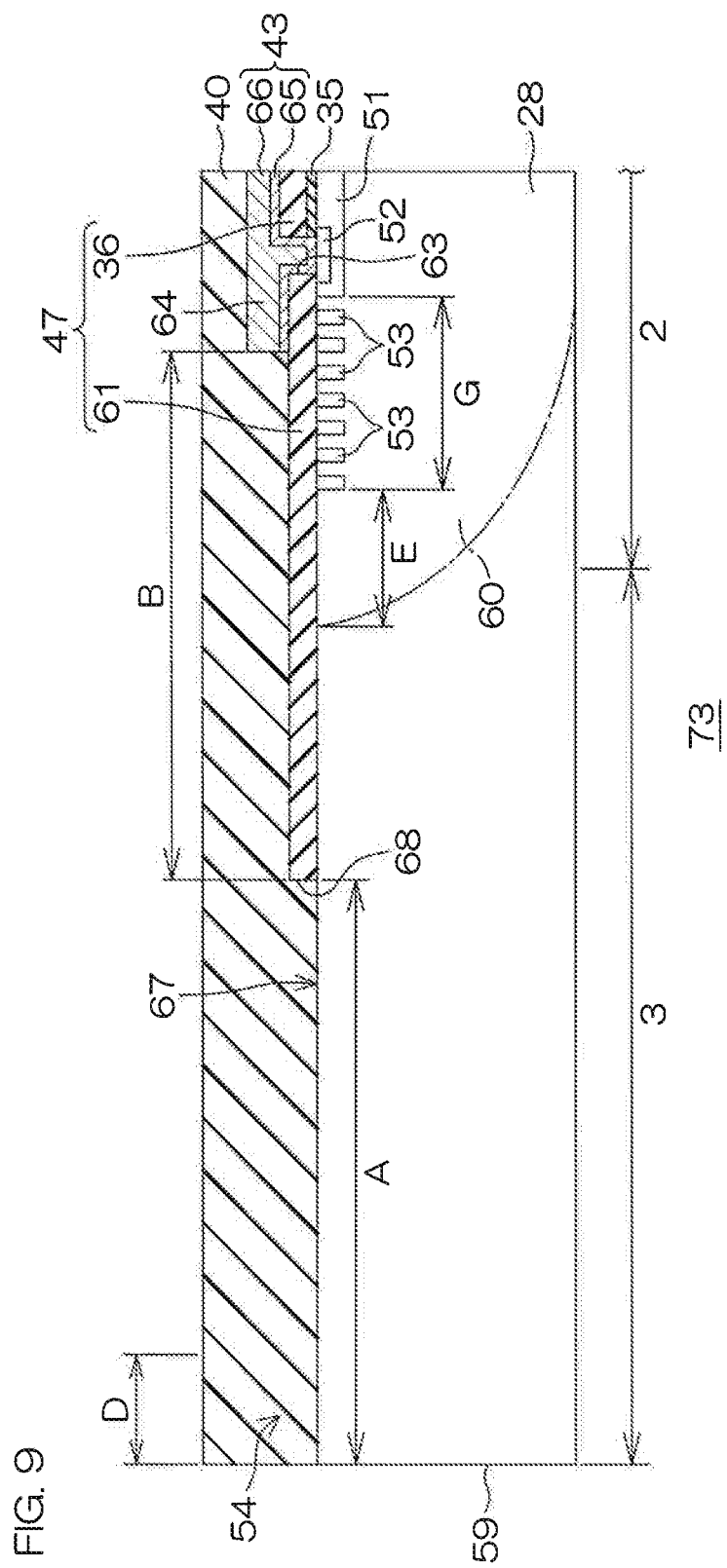
FIG. 9 is a schematic cross-sectional view of a semiconductor device according to an embodiment of the present invention.

In a semiconductor device 73 in FIG. 9, the end insulating film 62 is not formed, instead, the passivation film 40 covers the SiC epitaxial layer 28 up to the end surface 59. In this case, the dicing region 54 may be formed by defining a suitable width (D) from the end surface 59. Further, the distance (A) may be defined by the length from the end edge of the insulating film under metal 61 to the end surface 59 of the SiC epitaxial layer 28.

Figure 10:
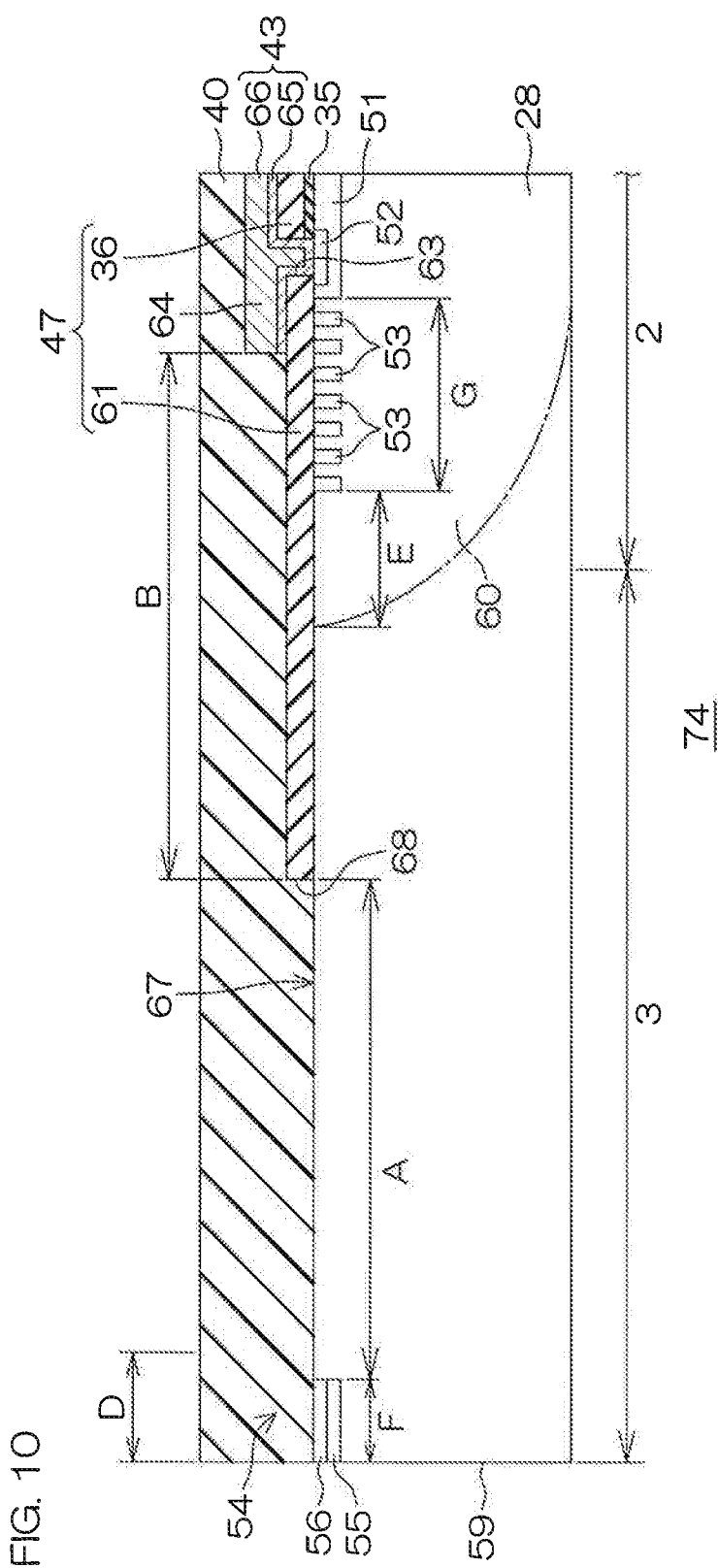
FIG. 10 is a schematic cross-sectional view of a semiconductor device according to an embodiment of the present invention.

A semiconductor device 74 shown in FIG. 10 has the same structure as the semiconductor device 73 shown in FIG. 9 except that the p type region 55 and the p⁺ type region 56 (p-type regions) are formed in the dicing region 54. In this case, the distance (A) may be defined by the length from the end edge of the insulating film under metal 61 to the p-type region. That is, the distance (A) of a section in which the passivation film 40 is in contact with the n-type portion of the SiC epitaxial layer 28 may be 40 μm or greater.

Figure 11:
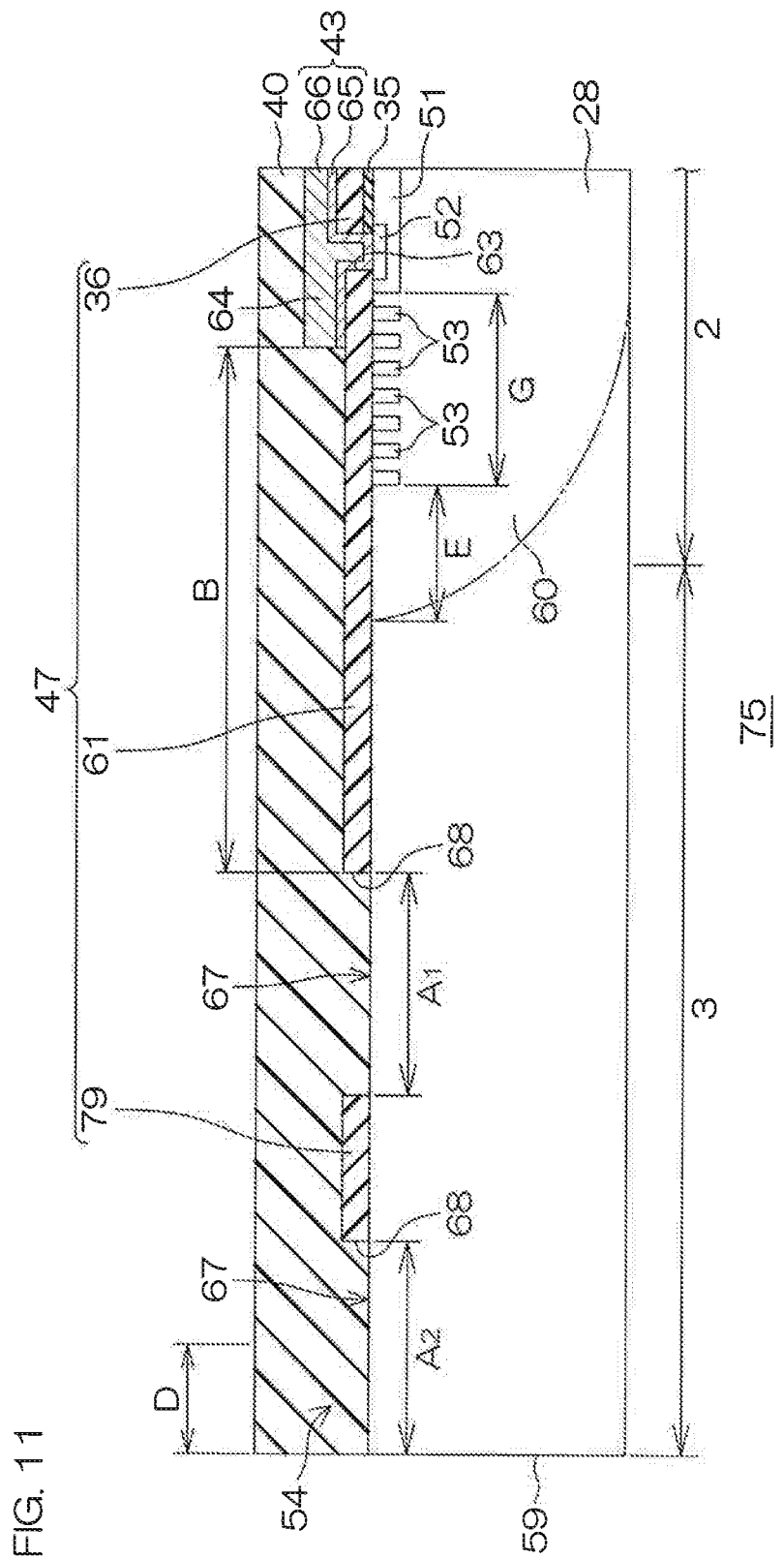
FIG. 11 is a schematic cross-sectional view of a semiconductor device according to an embodiment of the present invention.

A semiconductor device 75 shown in FIG. 11 has at least two openings 68 on the outer side of the insulating film under metal 61 in the insulating film 47. In this embodiment, each of the openings 68 is formed between the insulating film under metal 61 and an outer insulating film 79 and between the outer insulating film 79 and the end surface 59 of the SiC epitaxial layer 28. The passivation film 40 is in contact with the n-type regions 67 of the SiC epitaxial layer 28 over a distance ($A_1$) and a distance ($A_2$) in each opening 68. In this case, the distance of the section in which the passivation film 40 is in contact with the n-type region 67 can be represented as the sum of the distance ($A_1$) and the distance ($A_2$) of the respective contact sections, and the sum of the distances may be 40 μm or greater.

Figure 12:
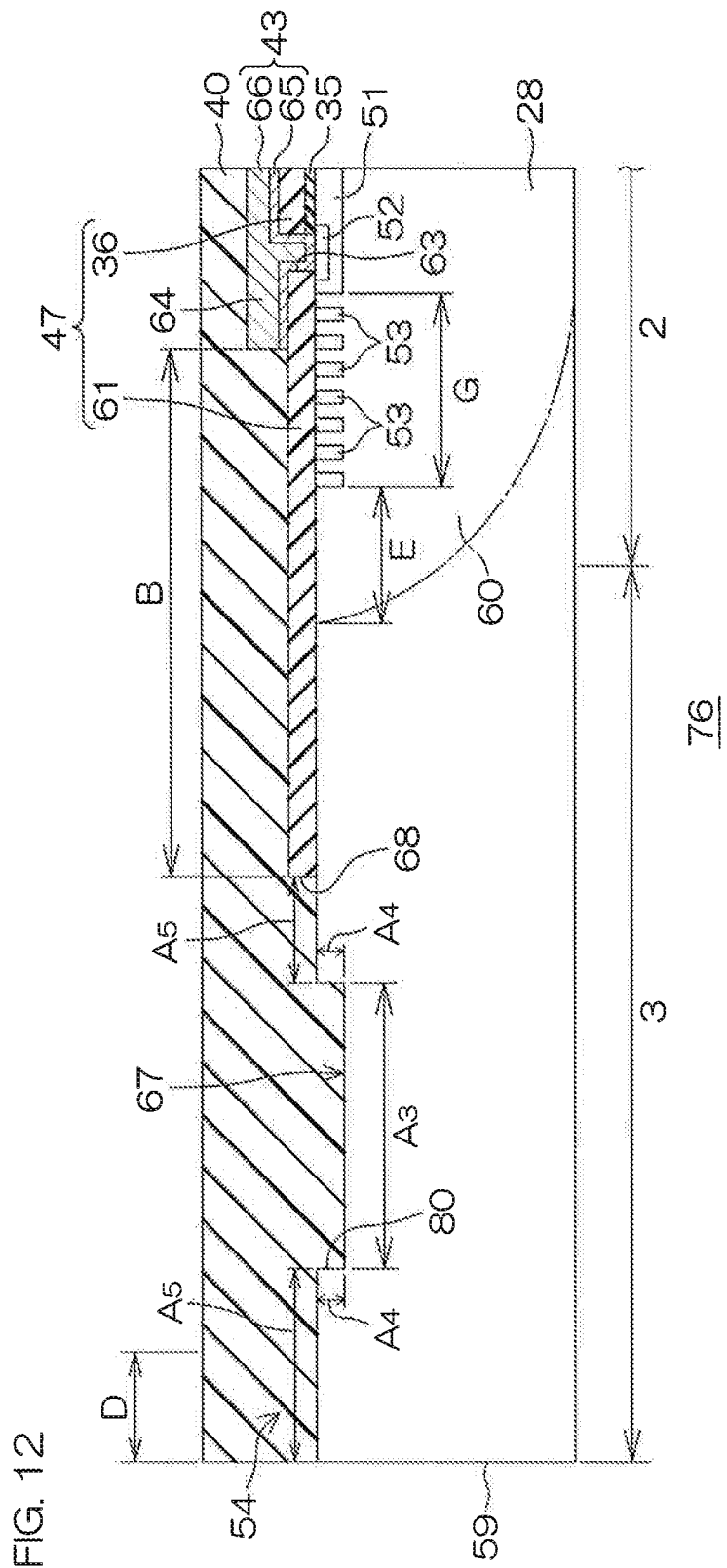
FIG. 12 is a schematic cross-sectional view of a semiconductor device according to an embodiment of the present invention.

A semiconductor device 76 shown in FIG. 12 has the same structure as the semiconductor device 73 shown in FIG. 9 except that a recess 80 is selectively formed in the n-type region 67. The passivation film 40 is in contact with the n-type region 67 on the inner surface (bottom surface and both lateral surfaces) of the recess 80. In this case, the distance of the section in which the passivation film 40 is in contact with the n-type region 67 can be defined as the total of the contact distance ($A_5$) excluding the recess 80, and the distance ($A_3$) and the distance ($A_4$) of the contact sections on the bottom surface and both lateral surfaces of the recess 80 respectively, and the total distance may be 40 μm or greater.

Figure 13:
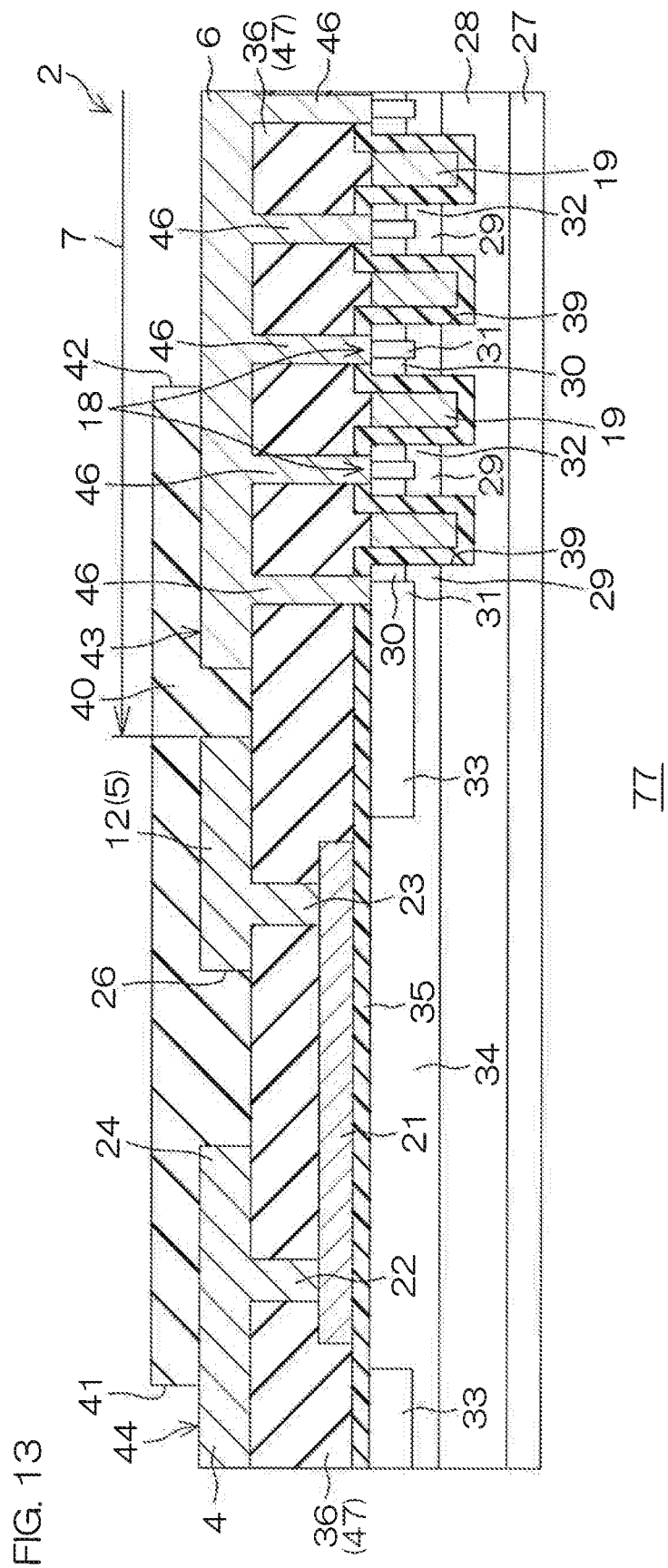
FIG. 13 is a schematic cross-sectional view of a semiconductor device according to an embodiment of the present invention.

In a semiconductor device 77 in FIG. 13, the transistor cell 18 is constituted by a MOSFET cell having a trench-gate structure. In this case, the gate electrode 19 is embedded in a gate trench 39 formed in each region between the plurality of the transistor cells 18 across the gate insulating film 35.

Figure 14:
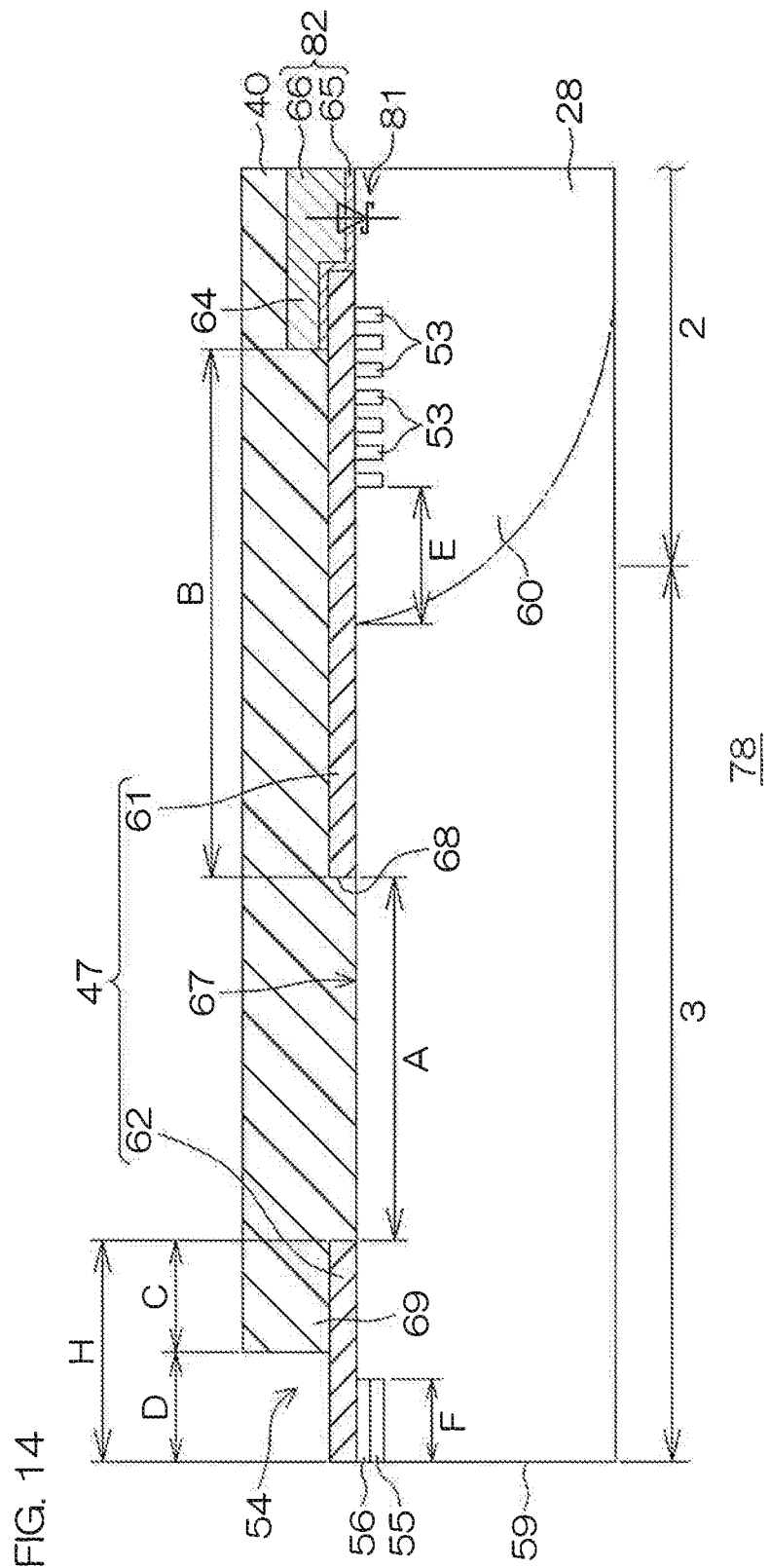
FIG. 14 is a schematic cross-sectional view of a semiconductor device according to an embodiment of the present invention.

In a semiconductor device 78 in FIG. 14, a schottky-barrier diode 81 is formed in the active region 2. That is, a schottky metal 82 that forms schottky junction with the SiC epitaxial layer 28 is provided in place of the source metal 43.

As described above, any of the semiconductor devices 72 to 78 has the following three features: (1) the distance (A) is 40 μm or greater; (2) the distance (B) is 40 μm or greater, or alternately is at least two times greater than the width (E) of the depletion layer 60; and (3) the end of the SiC epitaxial layer 28 is covered with an insulator (the end insulating film 62 or the passivation film 40). Therefore, these embodiments also can provide a SiC semiconductor device capable of preventing electrical discharge during an electrical characteristic test carried out in a wafer state while withstanding a high-temperature, high-humidity, high-voltage test similarly to the embodiments shown in FIGS. 1 to 6.

Although the embodiments according to the present invention have been described as above, the present invention can be also practiced by other embodiments.

For example, the transistor cell 18 may be an IGBT cell having a planar-gate structure or a trench-gate structure. In this case, a p⁺ type SiC substrate 27 may be used in place of the n⁺ type SiC substrate 27 in FIGS. 4 and 13. Alternately, the various types of the structures of semiconductor elements may be formed in the active region 2.

Further, the surface electrode of the source metal 43 or the schottky metal 82 does not need to be made of metal, and may be a semiconductor electrode such as polysilicon.

Further, the embedded resistor 21 does not need to be embedded in the interlayer film 36 under the gate metal 44, and instead, for example, polysilicon wiring for connecting the gate metal 44 and the gate finger 5 may be formed as an embedded resistor.

Further, a material having a resistance value that is greater than or equal to that of the gate metal 44 and the gate finger 5 (for example, metal wiring made of aluminum (Al), aluminum-copper alloy (AlCu), copper (Cu)) may be used as the material of the embedded resistor 21 instead of polysilicon. The total resistance value of the resistance value of the gate electrode 19 and the resistance value of the embedded resistor 21 can be increased because the distance between the gate metal 44 and the gate finger 5 can be increased, even though the embedded resistor 21 is made of metal.

Further, the embedded resistor 21 does not need to be formed under the gate metal 44, and may be formed under, for example, the gate finger 5.

Further, the embedded resistor 21 may be linearly formed along the part of the peripheral edge 24 of the gate metal 44, or may be annularly formed along the entire circumference of the peripheral edge 24 of the gate metal 44.

Further, the conductivity type of each semiconductor portion may be reversed in the semiconductor device 1. For example, p type may be changed to n type, and vice versa in the semiconductor device 1.

It is to be understood that variations and modifications can be made without departing from the scope and spirit of the present invention.

This application corresponds to Patent Application No. 2014-102699 submitted to Japanese Patent Office on May 16, 2014, and the entire contents of this application are hereby incorporated by reference.

DESCRIPTION OF THE REFERENCE NUMERALS

1 Semiconductor device
2 Active region
18 Transistor cell
19 Gate electrode
27 SiC substrate
28 SiC epitaxial layer
29 p⁻ type body region
30 n⁺ source region
31 p⁺ body contact region
32 Channel region
35 Gate insulating film
36 Interlayer film
39 Gate trench
40 Passivation film
43 Source metal
44 Gate metal
47 Insulating film
51 p⁻ type region
52 p⁺ type region
53 Guard ring
54 Dicing region
55 p⁻ type region
56 p⁺ type region
57 Wafer
58 Dicing line
59 End surface
60 Depletion layer
61 Insulating film under metal
62 End insulating film
63 Contact hole
64 Overlap portion
65 Ti/TiN film
66 Al—Cu film
67 n-type region
69 overlapped portion
72 Semiconductor device
73 Semiconductor device
74 Semiconductor device
75 Semiconductor device
76 Semiconductor device
77 Semiconductor device
78 Semiconductor device
79 Semiconductor device
80 Recess
81 Schottky-barrier diode
82 Schottky metal

What is claimed is:

1. A semiconductor device comprising:
    an SiC layer of a first conductivity type, the SiC layer having an active region in which a plurality of transistor elements are formed and an outer peripheral region formed around the active region;
    electrodes selectively formed on the SiC layer and electrically connected to at least one of the plurality of transistor elements, the electrodes including an input electrode and a gate electrode;
    an insulator formed on the SiC layer, extending toward a dicing region provided at an end portion of the SiC layer,
    wherein the insulator includes a first insulating film and a second insulating film formed under the input electrode and away from an end surface of the SiC layer, and a surface insulating layer formed over the insulator such that the surface insulating layer covers the insulator and a part of the input electrode, and the surface insulating layer is extended to reach the end surface of the SiC layer,
    the first insulating film is made of SiO$_2$, the first insulating film covering at least a part of the gate electrode,
    the second insulating film extends along a lateral direction perpendicular to a thickness direction of the SiC layer in a sectional view, the second insulating film having a contact portion with the gate electrode such that the contact portion is arranged under the gate electrode,
    the first insulating film is at least partially opposed to the second insulating film through the gate electrode,
    the surface insulating layer includes a first region and a second region,
    the first region is formed such that the surface insulating layer overlaps the first insulating film on the first region,
    the second region is formed such that the surface insulating layer is in contact with the SiC layer outside the first region,
    the surface insulating layer includes an organic insulating film,
    a first distance from the end portion of the SiC layer on the dicing region side to the insulator is 40 μm or greater,
    a lateral distance between an end portion of the electrodes and a portion of the surface insulating layer which is in contact with the SiC layer is 40 μm or greater, and
    the total of the first distance and the lateral distance is 180 μm or less.

2. The semiconductor device according to claim 1, further comprising a second insulator which is away from the insulator on the end surface side of the SiC layer, and does not reach the end surface of the SiC layer.

3. The semiconductor device according to claim 1, wherein the surface insulating layer is in contact with the SiC layer in the outer peripheral region over a distance of from 40 μm to 180 μm.

4. The semiconductor device according to claim 1, wherein a breakdown voltage value (BV) is 1000 V or greater.

5. The semiconductor device according to claim 1, wherein the impurity concentration of the first conductivity type of the SiC layer is $1\times10^{16}$ cm$^{-3}$ or less, and the thickness of the SiC layer is from 5 μm to 100 μm.

6. The semiconductor device according to claim 1, wherein the electrodes include a laminate structure represented by Ti/TiN/Al—Cu.

7. The semiconductor device according to claim 1, wherein the insulator has a thickness of 1 μm to 5 μm.

8. The semiconductor device according to claim 1, wherein the insulator includes an insulating material composed of SiN.

9. The semiconductor device according to claim 1, wherein the surface insulating layer includes a polyimide-based material.

10. The semiconductor device according to claim 1, wherein
a MOSFET is formed in the SiC layer as the at least one of the plurality of the transistor elements, and
the input electrode includes a source electrode electrically connected to a source of the MOSFET.

11. The semiconductor device according to claim 10, wherein the MOSFET has a planar-gate structure.

12. The semiconductor device according to claim 1, wherein
an IGBT is formed in the SiC layer as the at least one of the plurality of the transistor elements, and
the input electrode includes an emitter electrode electrically connected to an emitter of the IGBT.

13. The semiconductor device according to claim 1, wherein
the at least one of the plurality of the transistor elements which has the gate electrode, and
a resistor element is formed between the second insulating film and the surface insulating layer such that the resistor element is electrically connected to the gate electrode.

14. The semiconductor device according to claim 1, wherein
the at least one of the plurality of the transistor elements has a first portion of a second conductivity type formed on a surface portion of the SiC layer and a second portion of the second conductivity type formed on a surface portion of the first portion and having an impurity concentration higher than that of the first portion,
a contact hole is formed in the insulator such that the second portion of the at least one transistor element is exposed from the contact hole, and
the input electrode is electrically connected to the second portion of the at least one transistor element through the contact hole.

15. The semiconductor device according to claim 1, wherein the surface insulating layer has an end surface which is flush with the end surface of the SiC layer.

16. The semiconductor device according to claim 1, wherein a surface portion of the SiC layer which is in contact with the second region has a region of the first conductivity type.

17. The semiconductor device according to claim 1, wherein
the insulator includes an exposed portion which is exposed from the input electrode at the end surface side of the SiC layer with respect to an end portion of the input electrode, and
the surface insulating layer includes a first part which is in contact with the exposed portion between the end portion of the input electrode and a second part of the surface insulating layer which is in contact with the SiC layer.

18. The semiconductor device according to claim 1, wherein:
the surface insulating layer has a boundary between the first region and the second region, and
the second region has a first surface from the end surface of the SiC layer to the boundary, and the first surface is a flat surface.

19. The semiconductor device according to claim 18, wherein:
the at least one transistor element includes the first conductivity type source region, and
in the thickness direction of the SiC layer, a depth of the lowest point of the first surface is higher than a depth of the lowest point of the source region.

20. The semiconductor device according to claim 18, wherein,
the at least one transistor element includes the first conductivity type source region, and
in the thickness direction of the SiC layer, a depth of the lowest point of the first surface is the same as a depth of the highest point of the source region.

21. The semiconductor device according to claim 18, wherein:
the electrodes include a metal layer covering at least a part of the first insulating film, and
the surface insulating layer covers at least a part of the metal layer.

22. The semiconductor device according to claim 1, wherein the second insulating film is made of $SiO_2$.

23. The semiconductor device according to claim 1, wherein the second insulating film extends toward the dicing region such that an entire surface of the second insulating film is continuously flat.

24. The semiconductor device according to claim 23, wherein the entire surface of the second insulating film is continuously flat at a higher position than a contact surface of the second region of the surface insulating layer.

25. The semiconductor device according to claim 1, wherein
the SiC layer has a flat surface extending along the lateral direction,
the gate electrode is arranged on the flat surface of the SiC layer through the second insulating film.

26. The semiconductor device according to claim 1, wherein the second region extends from an end portion of the first region toward the end surface of the SiC layer such that a contact surface of the second region with the SiC layer is flat from the end portion of the first region to the end surface of the SiC layer.

27. The semiconductor device according to claim 1, wherein a contact surface of the second region of the surface insulating layer with the SiC layer is almost flat.

28. The semiconductor device according to claim 1, wherein the contact portion of the second insulating film is in contact with a horizontal center of the gate electrode at a position higher than a surface of the SiC layer in the thickness direction of the SiC layer.

29. The semiconductor device according to claim 1, wherein the second insulating film is adjacent to the first insulating film through a contact hole.

* * * * *